United States Patent
Huang et al.

(10) Patent No.: US 12,237,196 B2
(45) Date of Patent: *Feb. 25, 2025

(54) DOCKING DEVICE WITH MOVEABLE FRAME AND SEALING COMPONENT

(71) Applicant: Taiwan Semiconductor Manufacturing Company, Ltd., Hsinchu (TW)

(72) Inventors: Chih-Hung Huang, Hsinchu (TW); Cheng-Lung Wu, Zhunan Township (TW); Yang-Ann Chu, Hsinchu (TW); Hsuan Lee, Tainan (TW); Jiun-Rong Pai, Jhubei (TW)

(73) Assignee: Taiwan Semiconductor Manufacturing Company, Ltd., Hsinchu (TW)

( * ) Notice: Subject to any disclaimer, the term of this patent is extended or adjusted under 35 U.S.C. 154(b) by 9 days.

This patent is subject to a terminal disclaimer.

(21) Appl. No.: 18/317,312

(22) Filed: May 15, 2023

(65) Prior Publication Data

US 2023/0335424 A1     Oct. 19, 2023

Related U.S. Application Data

(63) Continuation of application No. 17/657,758, filed on Apr. 4, 2022, now Pat. No. 11,651,984, which is a continuation of application No. 17/248,073, filed on Jan. 7, 2021, now Pat. No. 11,302,552.

(51) Int. Cl.
*H01L 21/677* (2006.01)
*H01L 21/687* (2006.01)

(52) U.S. Cl.
CPC .. *H01L 21/67775* (2013.01); *H01L 21/67766* (2013.01); *H01L 21/67772* (2013.01); *H01L 21/68707* (2013.01)

(58) Field of Classification Search
CPC ......... H01L 21/67775; H01L 21/67766; H01L 21/67772
See application file for complete search history.

(56) References Cited

U.S. PATENT DOCUMENTS

| | | |
|---|---|---|
| 5,364,225 A | 11/1994 | Hecht et al. |
| 5,451,131 A | 9/1995 | Hecht et al. |

(Continued)

*Primary Examiner* — Gerald McClain
(74) *Attorney, Agent, or Firm* — Harrity & Harrity, LLP

(57) ABSTRACT

A multiple transport carrier docking device may be capable of storing and/or staging a plurality of transport carriers in a chamber of the multiple transport carrier docking device, and may be capable of forming an air-tight seal around a transport carrier in the chamber. Semiconductor wafers in the transport carrier may be accessed by a wafer transport tool while the air-tight seal around the transport carrier prevents and/or reduces the likelihood that contaminants in the semiconductor fabrication facility will reach the semiconductor wafers. The air-tight seal around the transport carrier may reduce defects of the semiconductor wafers that might otherwise be caused by the contaminants, may increase manufacturing yield and quality in the semiconductor fabrication facility, and/or may permit the continued reduction in device and/or feature sizes of integrated circuits and/or semiconductor devices that are to be formed on semiconductor wafers.

20 Claims, 19 Drawing Sheets

(56) References Cited

U.S. PATENT DOCUMENTS

| | | | |
|---|---|---|---|
| 5,469,963 A * | 11/1995 | Bonora | H01L 21/67396 |
| | | | 206/709 |
| 5,772,386 A | 6/1998 | Mages et al. | |
| 6,120,229 A | 9/2000 | Hofmeister | |
| 6,238,283 B1 | 5/2001 | Matsuyama et al. | |
| 6,431,806 B1 | 8/2002 | Doche | |
| 8,936,050 B2 | 1/2015 | Sugawara | |
| 9,082,807 B2 | 7/2015 | Sugawara | |
| 11,302,552 B1 | 4/2022 | Huang et al. | |
| 11,651,984 B2 | 5/2023 | Huang et al. | |
| 2006/0102237 A1 | 5/2006 | Le et al. | |
| 2007/0289844 A1 | 12/2007 | Fukazawa et al. | |
| 2008/0008564 A1 | 1/2008 | Bonora et al. | |
| 2008/0031708 A1 | 2/2008 | Bonora et al. | |
| 2008/0031709 A1 | 2/2008 | Bonora et al. | |
| 2008/0298933 A1 | 12/2008 | Hsiao et al. | |
| 2009/0092468 A1 * | 4/2009 | Oyama | H01L 21/67017 |
| | | | 414/222.01 |
| 2010/0028111 A1 * | 2/2010 | Krolak | H01L 21/67772 |
| | | | 414/810 |
| 2014/0064885 A1 | 3/2014 | Oyama et al. | |
| 2015/0301007 A1 | 10/2015 | Thovex et al. | |
| 2015/0311100 A1 | 10/2015 | Miyajima et al. | |
| 2020/0090966 A1 | 3/2020 | Newman | |

\* cited by examiner

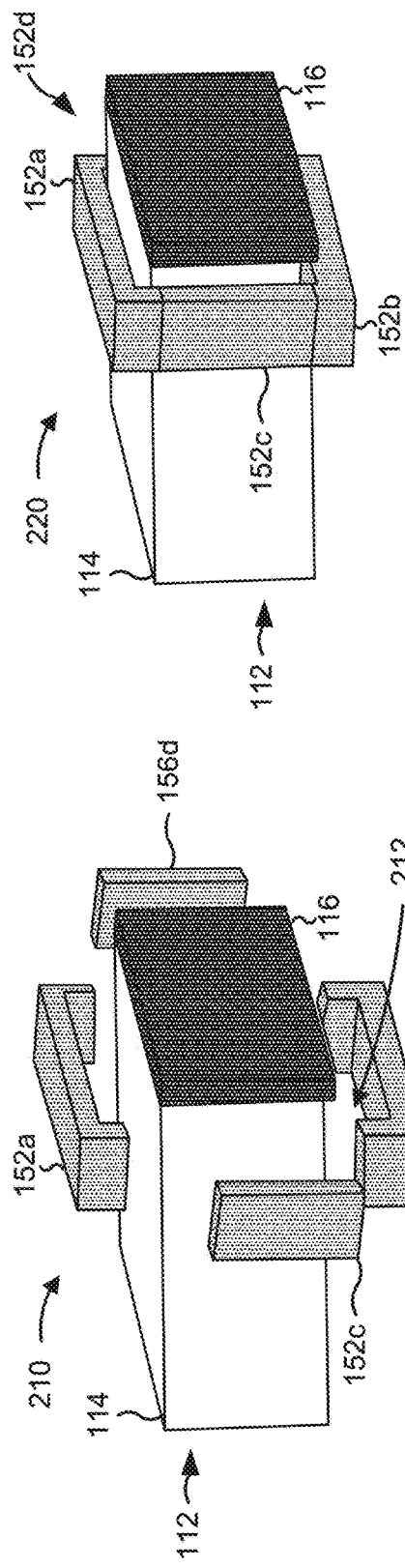
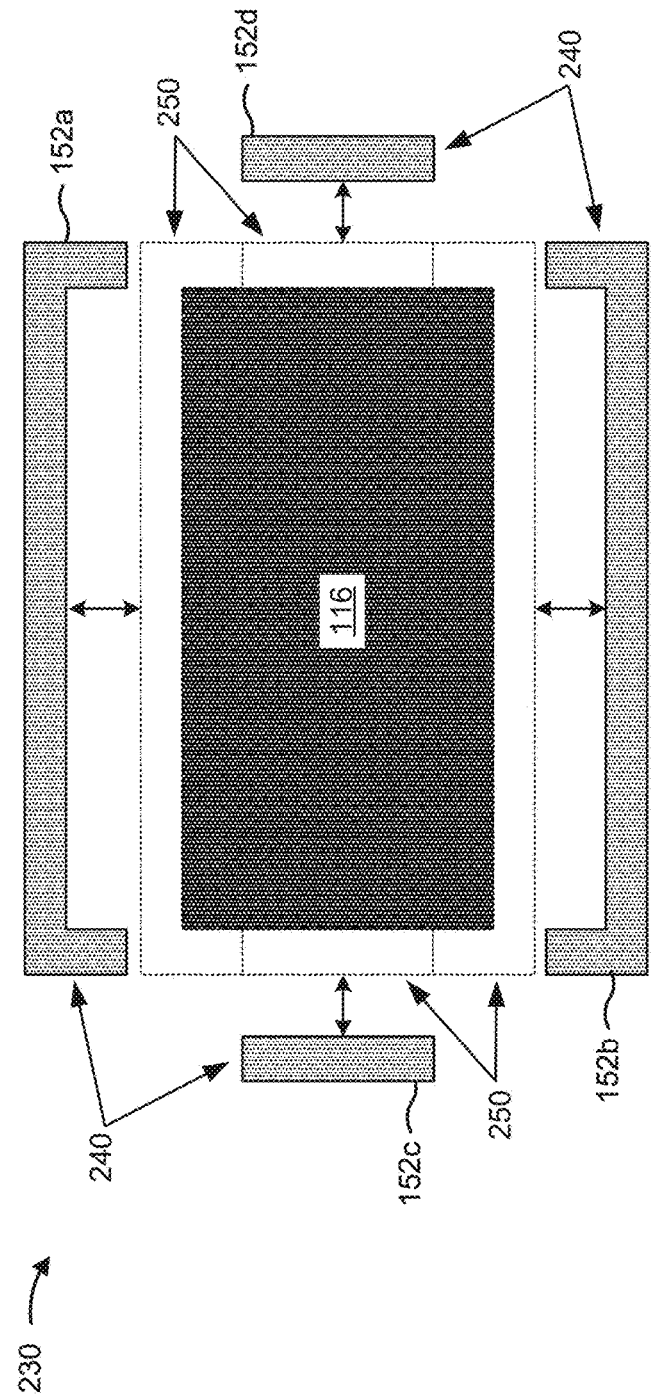
FIG. 2A
FIG. 2B

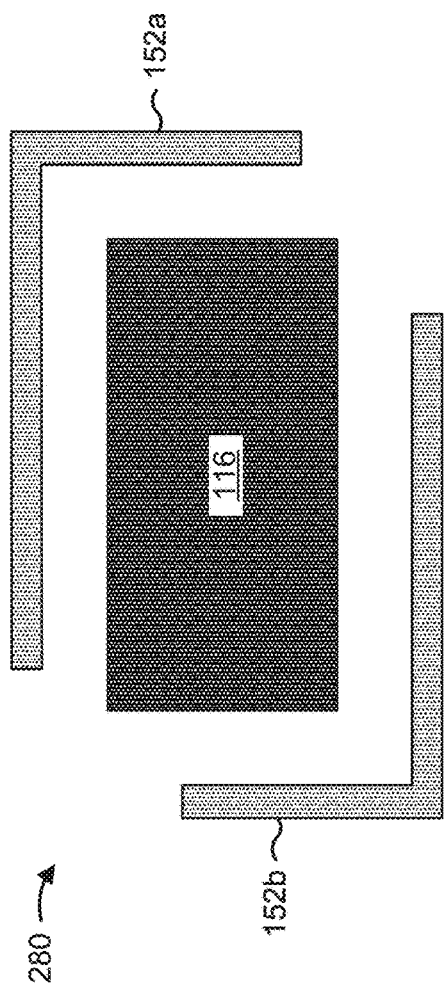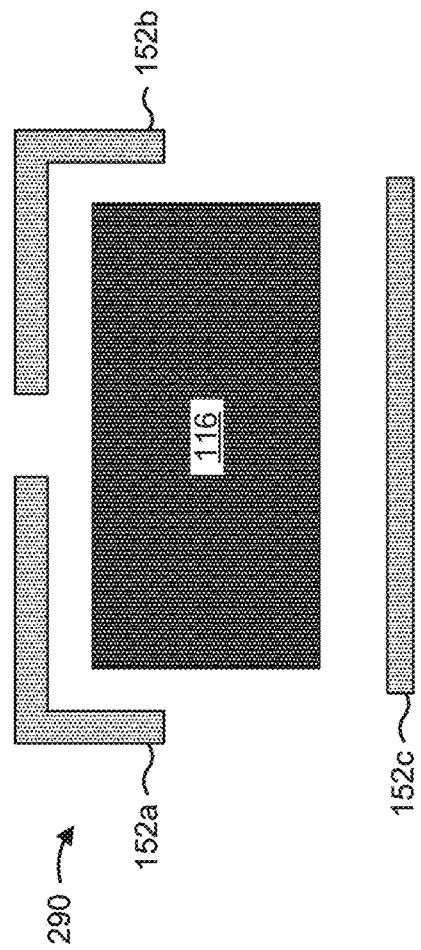

DOCKING DEVICE WITH MOVEABLE FRAME AND SEALING COMPONENT

RELATED APPLICATION

This application is a continuation of U.S. patent application Ser. No. 17/657,758, filed Apr. 4, 2022 (now U.S. Pat. No. 11,651,984), which is a continuation of U.S. patent application Ser. No. 17/248,073, filed Jan. 7, 2021 (now U.S. Pat. No. 11,302,552), the contents of which are incorporated herein by reference in their entireties.

BACKGROUND

A semiconductor wafer may be processed in various semiconductor processing tools in a semiconductor fabrication facility to produce various integrated circuits and/or semiconductor devices. A semiconductor wafer may be transported throughout the semiconductor fabrication facility and/or between the semiconductor processing tools in the semiconductor fabrication facility.

BRIEF DESCRIPTION OF THE DRAWINGS

Aspects of the present disclosure are best understood from the following detailed description when read with the accompanying figures. It is noted that, in accordance with the standard practice in the industry, various features are not drawn to scale. In fact, the dimensions of the various features may be arbitrarily increased or reduced for clarity of discussion.

FIGS. 2A-2F are diagrams of example implementations of a sealing component for forming an air-tight seal around a transport carrier described herein.

DETAILED DESCRIPTION

Figure 1:
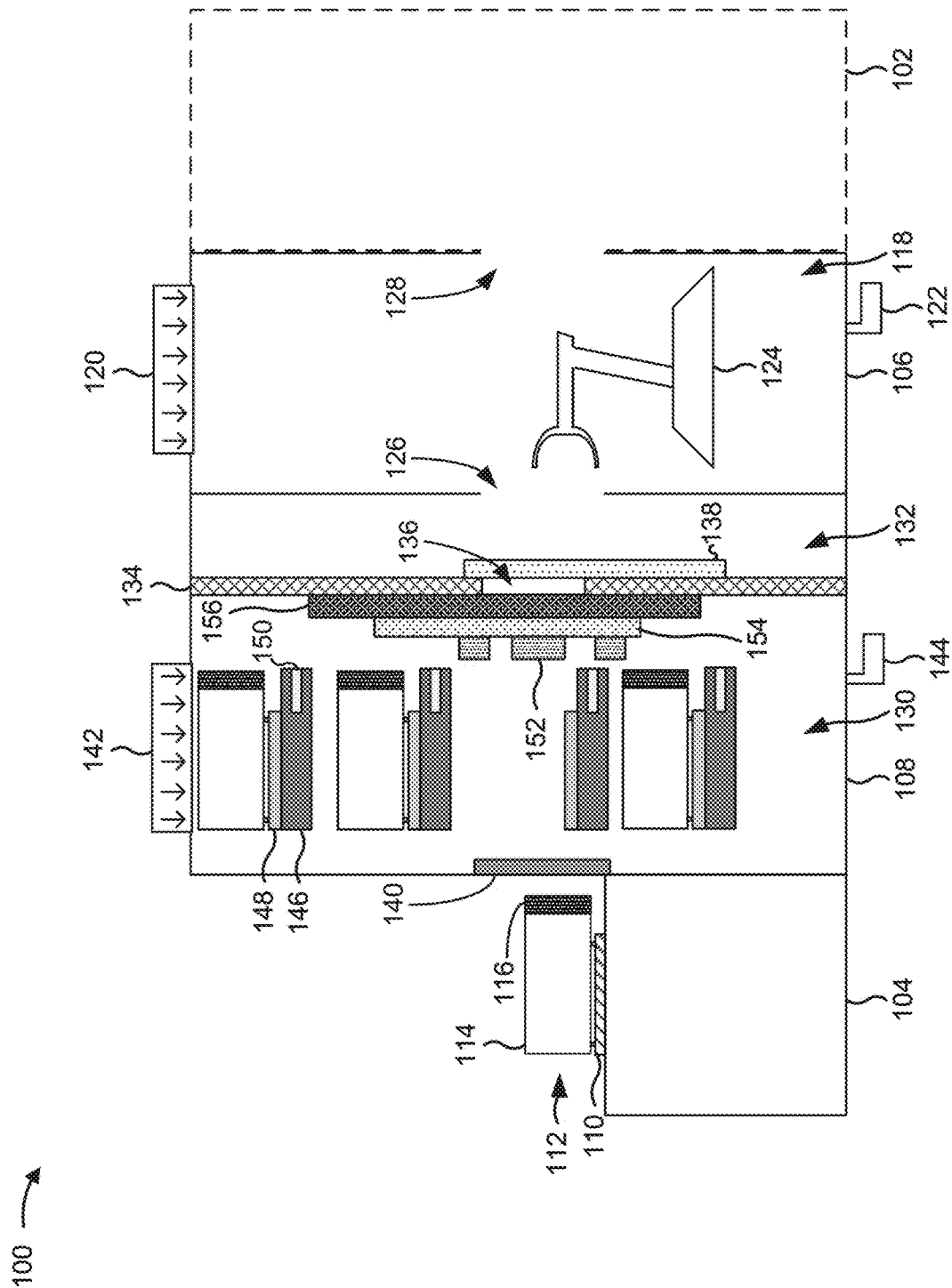
FIG. 1 is a diagram of an example semiconductor processing environment described herein.

The following disclosure provides many different embodiments, or examples, for implementing different features of the provided subject matter. Specific examples of components and arrangements are described below to simplify the present disclosure. These are, of course, merely examples and are not intended to be limiting. For example, the formation of a first feature over or on a second feature in the description that follows may include embodiments in which the first and second features are formed in direct contact, and may also include embodiments in which additional features may be formed between the first and second features, such that the first and second features may not be in direct contact. In addition, the present disclosure may repeat reference numerals and/or letters in the various examples. This repetition is for the purpose of simplicity and clarity and does not in itself dictate a relationship between the various embodiments and/or configurations discussed.

Further, spatially relative terms, such as "beneath," "below," "lower," "above," "upper" and the like, may be used herein for ease of description to describe one element or feature's relationship to another element(s) or feature(s) as illustrated in the figures. The spatially relative terms are intended to encompass different orientations of the device in use or operation in addition to the orientation depicted in the figures. The apparatus may be otherwise oriented (rotated 90 degrees or at other orientations) and the spatially relative descriptors used herein may likewise be interpreted accordingly.

A plurality of semiconductor wafers and/or other types of substrates may be transported throughout a semiconductor fabrication facility in a transport carrier. A transport carrier may include a wafer cassette, a front-opening unified pod (FOUP), a pod, a container, or a similar type of device. To transfer a semiconductor wafer from a transport carrier to a semiconductor processing tool, the transport carrier may be placed in and/or on a load port associated with the semiconductor processing tool. A transport tool included in an interface tool (e.g., an equipment front end module (EFEM) or similar type of interface tool) that is situated between the semiconductor processing tool and the load port may remove the semiconductor wafer from the transport carrier. The transport tool may transfer the semiconductor wafer from the transport carrier to the semiconductor processing tool through a chamber of the interface tool. The transport tool may perform the above-described process in reverse to transfer the semiconductor wafer from the semiconductor processing tool to the transport carrier after processing.

Semiconductor wafers may be exposed to contaminants (e.g., volatile organic compounds (VOCs), dust, debris, and other types of contaminants) in the semiconductor fabrication facility during transfer of the semiconductor wafers between a load port and an associated semiconductor processing tool. These contaminants may cause semiconductor device failures, may cause defects to occur in the integrated circuits and/or semiconductor devices formed in the semiconductor fabrication facility, and may reduce manufacturing yield and quality, among other examples. Moreover, the impact of the contaminants in the semiconductor fabrication facility may continue to become more significant due to decreased tolerance to the contaminants as device and/or feature sizes of the integrated circuits and/or semiconductor devices, that are to be formed on semiconductor wafers in the semiconductor fabrication facility, continue to shrink.

Some implementations described herein provide a multiple transport carrier docking device that can be positioned between a load port and an interface tool to reduce and/or minimize cross contamination of semiconductor wafers that are transferred between the load port and an associated semiconductor processing tool. The multiple transport carrier docking device may be capable of forming an air-tight seal around a transport carrier while the transport carrier is in a chamber of the multiple transport carrier docking device. In this way, semiconductor wafers in the transport carrier may be accessed by a transport tool while the air-tight seal around the transport carrier prevents and/or reduces the likelihood that contaminants in the semiconductor fabrication facility will reach the semiconductor wafers. Accordingly, the air-tight seal around the transport carrier may reduce defects of the semiconductor wafers that might otherwise be caused by the contaminants, may increase manufacturing yield and quality in the semiconductor fabrication facility, and/or may permit the continued reduction in device and/or feature sizes of integrated circuits and/or semiconductor devices that are to be formed on semiconductor wafers.

Moreover, the multiple transport carrier docking device is capable of storing and/or staging a plurality of transport carriers in the chamber at the same time. This may permit transport carriers to be cycled through more quickly as the associated semiconductor processing tool processes the semiconductor wafers included in the plurality of transport carriers, which may increase the capacity and throughput of the associated semiconductor processing tool.

FIG. 1 is a diagram of an example semiconductor processing environment 100 described herein. The example semiconductor processing environment 100 may include, or may be included in, a semiconductor fabrication facility, a semiconductor foundry, a semiconductor processing facility, a semiconductor clean room, and/or another environment in which semiconductor wafers and/or devices are processed. As shown in FIG. 1, the example semiconductor processing environment 100 may include a semiconductor processing tool 102, a load port 104, an interface tool 106, and a docking device 108, among other tools and/or devices.

The semiconductor processing tool 102 may include one or more tools configured to perform one or more semiconductor processing operations on one or more semiconductor wafers and/or devices. For example, the semiconductor processing tool 102 may include a deposition tool (e.g., a semiconductor processing tool configured to deposit one or more layers onto a semiconductor wafer), a plating tool (e.g., an electroplating tool configured to deposit one or more metal layers onto a semiconductor wafer), an exposure tool (e.g., an extreme ultraviolet (EUV) tool, an electron beam (e-beam) tool), an etch tool (e.g., a wet etch tool, a dry etch tool), or another type of semiconductor processing tool.

The load port 104 may include a shuttle platform 110 configured to receive and support a transport carrier 112. The load port 104 and the shuttle platform 110 may receive the transport carrier 112 from a transport robot, a transport cart, an overhead hoist transport (OHT), or another device configured to move transport carriers to and from various locations in the example semiconductor processing environment 100.

The transport carrier 112 may include a wafer cassette, a FOUP, a pod, a container, or a similar type of device configured to hold and/or store a plurality of semiconductor wafers. The transport carrier 112 may include a body 114 configured to rest on the shuttle platform 110. The body 114 may be further configured to store a plurality of semiconductor wafers, semiconductor devices, and/or substrates that are to be used in semiconductor processing. The transport carrier 112 may further include a carrier door 116. The carrier door 116 may be attached to the body 114 and may form an air-tight seal (e.g., a hermetic seal) between the carrier door 116 and the body 114 to reduce, minimize, and/or prevent contamination of the semiconductor wafers stored in the body 114.

The interface tool 106 may include an EFEM or another tool that includes a chamber 118. Air may be provided to the chamber 118 through a filter 120 (e.g., a high-efficiency particulate air (HEPA) filter or another type of air filter) configured to filter or remove particles and other contaminants from the incoming air. The chamber 118 may further be vented through an exhaust 122.

The interface tool 106 may further include a wafer transport tool 124 in the chamber 118. The wafer transport tool 124 may include a robotic arm or another type of tool that is configured to transport semiconductor wafers between a transport carrier 112 and the semiconductor processing tool 102. The wafer transport tool 124 may receive and/or obtain a semiconductor wafer from a transport carrier 112 through an opening 126 between the docking device 108 and the interface tool 106, and may provide the semiconductor wafer to the semiconductor processing tool 102 through an opening 128 between the interface tool 106 and the semiconductor processing tool 102. Moreover, the wafer transport tool 124 may receive and/or obtain a semiconductor wafer from a semiconductor processing tool 102 through the opening 128, and may provide the semiconductor wafer to a transport carrier 112 through the opening 126. In some implementations, the wafer transport tool 124 transfers semiconductor wafers between a transport carrier 112 and a staging area of the semiconductor processing tool 102. In some implementations, the wafer transport tool 124 transfers semiconductor wafers between a transport carrier 112 and a processing chamber of the semiconductor processing tool 102.

The docking device 108 is a device that is configured to permit the transfer of semiconductor wafers between a transport carrier 112 and the semiconductor processing tool 102 in a manner that reduces the likelihood of exposure of semiconductor wafers to contaminants that may be present in the example semiconductor processing environment 100. The docking device 108 may be referred to as a multiple transport carrier docking device in that the docking device 108 is configured to (and/or capable of) storing and/or staging a plurality of transport carriers 112 in a first chamber 130, as shown in FIG. 1. The wafer transport tool 124 may access a transport carrier 112 (e.g., the body 114 of the transport carrier 112) through the opening 126 and through a second chamber 132 of the docking device 108.

The first chamber 130 and the second chamber 132 may be separated by a divider wall 134. The divider wall 134 may include a rigid or semi-rigid structure that extends from the top of the first chamber 130 and the second chamber 132, to the bottom of the first chamber 130 and the second chamber 132. The divider wall 134 may further extend from one side of the first chamber 130 and the second chamber 132 to another (opposing) side of the first chamber 130 and the second chamber 132.

An opening 136 may be provided through the divider wall 134, which may be sealed by a chamber door 138. In particular, the chamber door 138 may be pressed against the divider wall 134 to form an air-tight seal (e.g., a hermetic seal) between the divider wall 134 and the chamber door 138. The air-tight seal between the divider wall 134 and the chamber door 138 functions as an air-tight seal between the first chamber 130 and the second chamber 132. The divider wall 134 and the chamber door 138 may form the air-tight seal when the chamber door 138 is in a closed position, as shown in FIG. 1. The air-tight seal may reduce, minimize, and/or eliminate the likelihood that contaminants in the example semiconductor processing environment 100 might otherwise travel from the first chamber 130 to the second chamber 132 through the opening 136 in the divider wall 134.

In some implementations, the divider wall 134 and/or the chamber door 138 may include a gasket, a strip, or another component to form the air-tight seal. The gasket of the divider wall 134, if included, may be formed around the opening 136 in the divider wall 134. The gasket of the chamber door 138, if included, may be formed in a shape that substantially fits around the opening 136 in the divider wall 134. The gasket of the divider wall 134 and/or the gasket of the chamber door 138 may be formed of a soft material and/or of a deformable material to permit the air-tight seal to be formed. For example, the gasket of the divider wall 134 and/or the gasket of the chamber door 138 may be formed of a plastic material, a rubber material, a silicone material, or a similar material. In some implementations, the material of the gasket of the divider wall 134 and/or the gasket of the chamber door 138 includes a gas impermeable material.

The first chamber 130 of docking device 108 may include a door 140 that seals around an opening at a first side (e.g., a first side wall) of the docking device 108. In some implementations, the door 140 (and the associated opening) is on an opposing side of the docking device 108 to the opening 126, which may be at a second side (e.g., a second side wall) of the docking device 108. In some implementations, the door 140 (and the associated opening) and the opening 126 are on adjacent sides (e.g., adjacent side walls) of the docking device 108.

The door 140 (and the associated opening) may be orientated toward the load port 104 to permit transport carriers 112 to be transferred between the shuttle platform 110 and the first chamber 130. The door 140 may be opened (e.g., removed from the opening) to provide access to the first chamber 130 for insertion of a transport carrier 112 into the first chamber 130, and for removal of a transport carrier 112 from the first chamber 130. The opening 126 may provide access to the second chamber 132 for the wafer transport tool 124.

Air may be provided to the first chamber 130 through a filter 142 (e.g., a HEPA filter or another type of air filter) configured to filter or remove particles and other contaminants from the incoming air flowing into the first chamber 130. The first chamber 130 may further be vented through an exhaust 144.

As indicated above, the docking device 108 may be configured to store and/or stage a plurality of transport carriers 112 in the first chamber 130. The first chamber 130 may include a plurality of moveable platforms 146 on which transport carriers 112 may be placed and/or supported. Each moveable platform 146 may be configured support a respective transport carrier 112. Each movable platform 146 may be sized to a greater size relative to the transport carriers 112 (e.g., a greater length and/or a greater width) to reduce, minimize, and/or prevent vibration of the transport carriers. The movable platforms 146 may be configured to slide and/or otherwise move in one or more directions within the first chamber 130 to permit access to each moveable platform 146 through the opening that is orientated toward the load port 104. For example, the moveable platforms 146 may be configured to slide and/or otherwise move in a vertical direction (e.g., up and down) in the first chamber 130. As another example, the moveable platforms 146 may be configured to slide and/or otherwise move in a horizontal direction (e.g., side to side) in the first chamber 130. As another example, the moveable platforms 146 may be configured to slide and/or otherwise move in a vertical direction (e.g., up and down) and in a horizontal direction (e.g., side to side) in the first chamber 130. In these examples, all of the moveable platforms 146 may move together at the same time, or individual moveable platforms 146 may move independently of the other moveable platforms 146.

The docking device 108 may include a plurality of shuttle trays 148. Each moveable platform 146 may include a respective shuttle tray 148 and one or more latches 150. Each shuttle tray 148 may be configured to receive and support a respective transport carrier 112. Moreover, each shuttle tray 148 may slide or otherwise move in one or more directions to move a transport carrier 112 toward and away from a sealing component 152 in the first chamber 130. For example, a shuttle tray 148 may slide and/or otherwise move relative to an associated moveable platform 146 to extend toward the sealing component 152, and may slide and/or otherwise move relative to the associated moveable platform 146 to retract away from the sealing component 152.

The one or more latches 150 included in a moveable platform 146 may be attached, connected, and/or otherwise supported by the moveable platform 146. The one or more latches 150 may be configured to extend away from the moveable platform 146 and toward a moveable frame 154 to which the sealing component 152 is attached, mounted, and/or otherwise supported. Moreover, the one or more latches 150 may be configured to retract toward the moveable platform 146 and away from the moveable frame 154. The one or more latches 150 may connect to the moveable platform 146 when the one or more latches 150 are extended. This permits movement of the moveable platform 146 to cause the moveable frame 154 to move along with the moveable platform 146. In this way, the moveable frame 154 may be an unpowered moveable frame (e.g., a moveable frame without a dedicated motor and/or drive mechanism to move the moveable frame), which reduces the complexity of the moveable frame 154. Moreover, the one or more latches 150 permit the movement of the moveable platform 146 and the movement of the moveable frame 154 to be synchronized.

The sealing component 152 included in the first chamber 130 of the docking device 108 may be configured to reduce, minimize, and/or eliminate the likelihood of exposure to contaminants that may be present in the example semiconductor processing environment 100 when a semiconductor wafer is transferred between the transport carrier 112 and the semiconductor processing tool 102. The sealing component 152 may be pressed against the moveable frame 154 on a side (or face) of the moveable frame 154 facing the first chamber 130. One or more gaskets may be located between the sealing component 152 and moveable frame 154 to reduce, minimize, and/or prevent air (and contaminants carried by the air) from passing between the sealing component 152 and the moveable frame 154.

The sealing component 152 may include one or more portions that are configured to form an air-tight seal (e.g., a hermetic seal) around a transport carrier 112 when a transport carrier 112 is extended toward the sealing component 152 on a shuttle tray 148. For example, the shuttle tray 148 may slide or otherwise move the transport carrier 112 toward the sealing component 152 in the first chamber 130. With the transport carrier 112 extended toward the sealing component 152, the sealing component 152 may contract around the transport carrier 112 (e.g., around the body 114 of the transport carrier 112) to form the air-tight seal between the sealing component 152 and the transport carrier 112.

The one or more portions of the sealing component 152 may be positioned around an opening in the moveable frame 154. The carrier door 116 of the transport carrier 112 may extend into and/or through the opening in the moveable frame 154 when the transport carrier 112 extended toward the sealing component 152. This permits the one or more portions of the sealing component 152 to contract around the body 114 of the transport carrier 112 (e.g., to form the air-tight seal around the body 114 of the transport carrier 112) as opposed to the carrier door 116 of the transport carrier 112, which permits the carrier door 116 to be removed from the body 114 of the transport carrier 112.

In some implementations, the sealing component 152 (or the portions thereof) are formed of a relatively soft material (e.g., softer than the material of the body 114 of the transport carrier 112) to permit the air-tight seal to be formed around the transport carrier 112. For example, the sealing component 152 (or the portions thereof) may be formed of a plastic material, a rubber material, a silicone material, a gas impermeable, or a similar material. In some implementations, the sealing component 152 (or the portions thereof) includes a gasket, a strip, or a similar component formed of a relatively soft material that is pressed against the body 114 of the transport carrier 112 to form the air-tight seal.

When the air-tight seal is formed between the sealing component 152 and a transport carrier 112, the chamber door 138 may remove the carrier door 116 from the body 114 of the transport carrier 112. After removing the carrier door 116, the chamber door 138 may transition from the closed position shown in FIG. 1 to an open position, which releases the air-tight seal between divider wall 134 and the chamber door 138. Here, the chamber door 138 (with the removed carrier door 116) may move backwards away from the divider wall 134 toward the opening 126, and may move downward into the second chamber 132 (e.g., after moving backwards away from the divider wall 134). In this way, the opening 136 in the divider wall 134 is cleared such that the wafer transport tool 124 is permitted to access the transport carrier 112 (e.g., the body 114 of the transport carrier 112) through the opening 136 in the divider wall 134 and the opening 126 while the air-tight seal is formed around the transport carrier 112 by the sealing component 152.

Prior to removing the carrier door 116 from the body 114 of the transport carrier 112, the moveable platform 146 on which the transport carrier 112 may move to adjust the position of the transport carrier 112. In this way, the moveable platform 146 may move to align the carrier door 116, the opening in the moveable frame 154, and the opening 136 in the divider wall 134 so that the carrier door 116 is accessible by the chamber door 138, and so that the carrier door 116 may pass through the opening in the moveable frame 154 and the opening 136 in the divider wall 134.

The moveable frame 154 may be permitted to slide and/or otherwise move along a set of tracks 156. The track(s) 156 may be mounted, connected, attached, and/or supported by the divider wall 134. The track(s) 156 may include one or more tracks, one or more rails, one or more tubes, roller bearings, or there types of structures that permit the moveable frame 154 to slide and/or otherwise move based on movement of a moveable platform 146. The track(s) 156 may include one or more elongated members that extend parallel to the direction of travel of the moveable frame 154. The length of the elongated members may be greater than the length of the moveable frame 154 to permit the moveable frame to move along the track(s) 156.

In some implementations, the docking device 108 includes one or more sensors (e.g., proximity sensors, hall effect sensors, or other types of sensors) configured to detect and/or indicate whether the carrier door 116, the opening in the moveable frame 154, and the opening 136 are aligned. In some implementations, the one or more sensors cause an indication (e.g., a visual indication, an audible indication, or another type of indication) to be presented to an operator if the moveable platform 146 is manually operated by the operator. In some implementations, the one or more sensors automatically cause the movement of the moveable platform 146 to stop based on detecting or determining that alignment between the carrier door 116, the opening in the moveable frame 154, and the opening 136. In some implementations, the one or more sensors automatically provide a signal, a message, or another type of indicator to a processor or controller of the docking device 108 based on detecting or determining that alignment between the carrier door 116, the opening in the moveable frame 154, and the opening 136, and the processor or controller automatically causes the movement of the moveable platform 146 to stop based on the indicator.

The wafer transport tool 124 may transfer semiconductor wafers between the transport carrier 112 and the semiconductor processing tool 102 after the air-tight seal is formed around the transport carrier 112 by the sealing component 152, and after the chamber door 138 is opened. For example, the wafer transport tool 124 may obtain and/or retrieve a semiconductor wafer from the transport carrier 112 through the opening 136 in the divider wall 134 and through the opening 126, and may provide the semiconductor wafer to the semiconductor processing tool 102 through the opening 128. As another example, the wafer transport tool 124 may obtain a semiconductor wafer from the semiconductor processing tool 102 through the opening 128, and may provide the semiconductor wafer to the transport carrier 112 through the opening 126 and the opening 136 in the divider wall 134.

In this way, with the carrier door 116 removed and the chamber door 138 in the open position, air-tight seals are formed between the body 114 of the transport carrier 112 and the side wall on which the opening 126 is located. In particular, an air-tight seal may be formed between the body 114 of the transport carrier 112 and the sealing component 152, an air-tight seal may be formed between the sealing component 152 and the moveable frame 154, an air-tight seal may be formed between the moveable frame and a side of the divider wall 134, an air-tight seal may be formed between the divider wall 134 and the top, bottom, and sides of the first chamber 130 and the second chamber 132. This provides an air-tight seal from the transport carrier 112 through the second chamber 132 and to the opening 128. The air-tight seal from the transport carrier 112 through the second chamber 132 and to the opening 128 permits the transport carrier 112 to be accessed without exposing the semiconductor wafers that are between the transport carrier 112 and the semiconductor processing tool 102 to contaminants in the example semiconductor processing environment 100.

As indicated above, FIG. 1 is provided as an example. Other examples may differ from what is described with regard to FIG. 1.

Figure 2C:
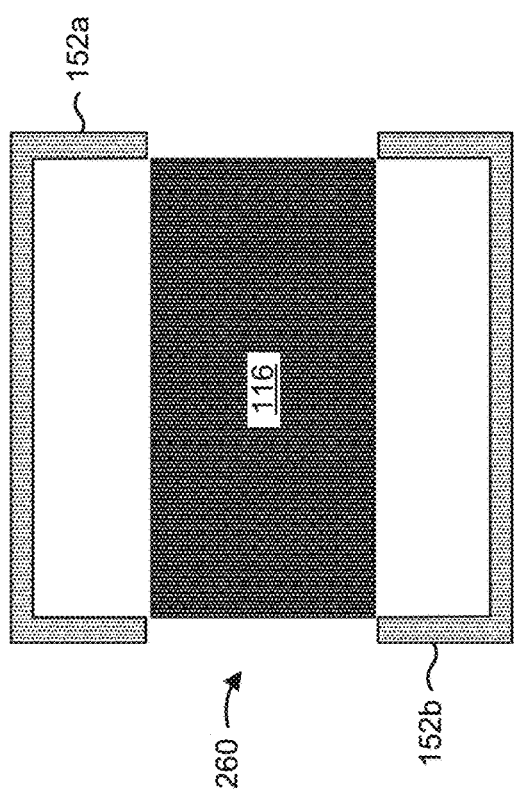

FIGS. 2A-2F are diagrams of example implementations of the sealing component 152 for forming an air-tight seal around a transport carrier 112 described herein. FIG. 2A illustrates perspective views of example implementations 210 and 220 of the sealing component 152 in which the sealing component 152 includes four portions: a portion 152a, a portion 152b, a portion 152c, and a portion 152d. Example implementation 210 illustrates an example of the sealing component 152 in an expanded configuration, where the portion 152a, the portion 152b, the portion 152c, and the portion 152d are not contracted around the body 114 of the transport carrier 112. In this configuration, the portion 152a, the portion 152b, the portion 152c, and the portion 152d may spaced away from the body 114 of the transport carrier 112 at a distance that permits the door 140 and the body 114 of the transport carrier 112 to fit through an opening 212 formed by the portion 152a, the portion 152b, the portion 152c, and the portion 152d. The opening 212 may be referred to as an airflow/vacuum hole.

As further shown in the example implementation 220 in FIG. 2A, the sealing component 152 may transition to a contracted configuration, in which the portion 152a, the portion 152b, the portion 152c, and the portion 152d are contracted around the body 114 of the transport carrier 112 to form the air-tight seal around the transport carrier 112.

FIG. 2B illustrates an elevation view of an example implementation 230, which shows a first position 240 of the portion 152a, the portion 152b, the portion 152c, and the portion 152d, and a second position 250 of the portion 152a, the portion 152b, the portion 152c, and the portion 152d. The first position 240 may correspond to the expanded configuration illustrated in the example implementation 210 of FIG. 2A, and the second position 250 may correspond to the contracted configuration illustrated in the example implementation 220 of FIG. 2A.

As shown in FIG. 2B, in some implementations, the portion 152a, the portion 152b, the portion 152c, and the portion 152d may each transition between the first position 240 and the second position 250. For example, the portion 152a may move downward from the first position 240 to the second position 250, and may move upward from the second position 250 to the first position 240. As another example, the portion 152b may move upward from the first position 240 to the second position 250, and may move downward from the second position 250 to the first position 240. As another example, the portion 152c and the portion 152d may each move inward from the first position 240 to the second position 250, and may each move outward from the second position 250 to the first position 240. In some implementations, one or more of the portion 152a, the portion 152b, the portion 152c, or the portion 152d transition between the first position 240 and the second position 250 in a non-linear path of travel. In some implementations, one or more of the portion 152a, the portion 152b, the portion 152c, or the portion 152d transition between the first position 240 and the second position 250 in a non-linear path of travel.

As further shown in FIG. 2B, in the example implementation 230, the portion 152a may cover a first portion of the top of the transport carrier 112, a first portion of a first side of the transport carrier 112, and a first portion of a second side of the transport carrier 112 opposing the first side. The portion 152b may cover a first portion of the bottom of the transport carrier 112, a second portion of the first side of the transport carrier 112, and a second portion of the second side of the transport carrier 112. The portion 152c may cover a second portion of the top of the transport carrier 112, a third portion of a first side of the transport carrier 112, and a second portion of the bottom of the transport carrier 112. The portion 152d may cover a third portion of the top of the transport carrier 112, a third portion of a first side of the transport carrier 112, and a third portion of the bottom of the transport carrier 112.

The first portion of the top covered by the portion 152a, the second portion of the top covered by the portion 152c, and the third portion of the top covered by the portion 152d may substantially encompass the entire top of the transport carrier 112. The first portion of the bottom covered by the portion 152b, the second portion of the bottom covered by the portion 152c, and the third portion of the top covered by the portion 152d may substantially encompass the entire bottom of the transport carrier 112. The first portion of the first side covered by the portion 152a, the second portion of the first side covered by the portion 152b, and the third portion of the first side covered by the portion 152c may substantially encompass the entire first side of the transport carrier 112. The first portion of the second side covered by the portion 152a, the second portion of the second side covered by the portion 152b, and the third portion of the second covered by the portion 152d may substantially encompass the entire second side of the transport carrier 112.

Other example implementations of the sealing component 152 having four portions may be used with the docking device 108.

FIG. 2C illustrates an elevation view of an example implementation 260. In the example implementation 260, the sealing component 152 includes a plurality of portions: a portion 152a and a second portion 152b. The portion 152a may cover substantially the entire top of the transport carrier 112, a first portion of a first side of the transport carrier 112, and a first portion of a second side of the transport carrier 112 opposing the first side. The portion 152b may cover substantially the entire bottom of the transport carrier 112, a second portion of the first side of the transport carrier 112, and a second portion of the second side of the transport carrier 112. The first portion of the first side covered by the portion 152a, and the second portion of the first side covered by the portion 152b may substantially encompass the entire first side of the transport carrier 112. The first portion of the second side covered by the portion 152a, and the second portion of the second side covered by the portion 152b may substantially encompass the entire second side of the transport carrier 112.

Figure 2D:
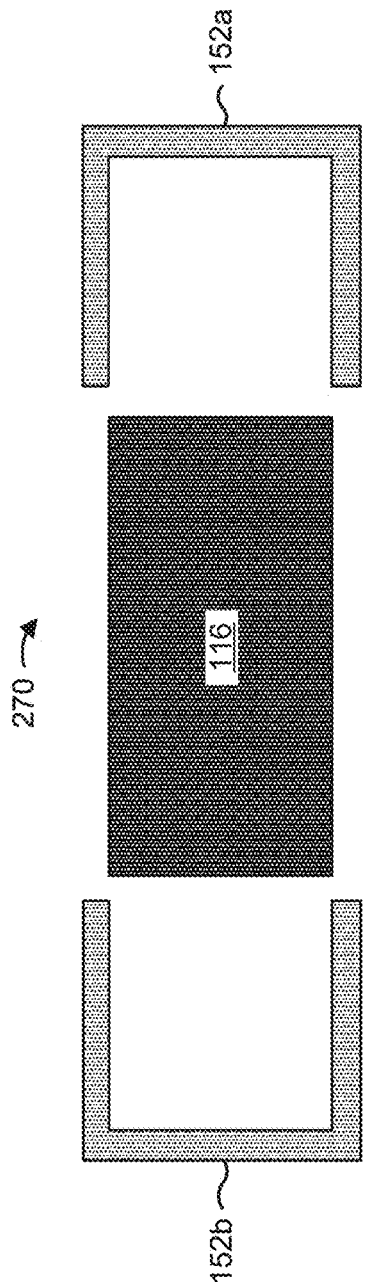

FIG. 2D illustrates an elevation view of an example implementation 270. In the example implementation 270, the sealing component 152 includes a plurality of portions: a portion 152a and a second portion 152b. The portion 152a may cover substantially an entire first side of the transport carrier 112, a first portion of the top of the transport carrier 112, and a first portion of the bottom of the transport carrier 112. The portion 152b may cover substantially an entire second side of the transport carrier 112 opposing the first side, a second portion of the top of the transport carrier 112, and a second portion of the bottom of the transport carrier 112. The first portion of the top covered by the portion 152a, and the second portion of the top covered by the portion 152b may substantially encompass the entire top of the transport carrier 112. The first portion of the bottom covered by the portion 152a, and the second portion of the bottom covered by the portion 152b may substantially encompass the entire bottom of the transport carrier 112.

FIG. 2E illustrates an elevation view of an example implementation 280. In the example implementation 280, the sealing component 152 includes a plurality of portions: a portion 152a and a portion 152b. As shown in FIG. 2E, in the example implementation 280, the portion 152a may cover substantially the entire top of the transport carrier 112 and substantially an entire first side of the transport carrier 112. The portion 152b may cover substantially the entire bottom of the transport carrier 112 and substantially an entire second side of the transport carrier 112 opposing the first side. Other example implementations of the sealing component 152 having four portions may be used with the docking device 108.

FIG. 2F illustrates an elevation view of an example implementation 290. In the example implementation 290, the sealing component 152 includes a plurality of portions: a portion 152a, a portion 152b, and a portion 152c. The portion 152a may cover a first portion of the top of the transport carrier 112 and substantially an entire first side of the transport carrier 112. The portion 152b may cover a second portion of the top side of the transport carrier 112 and substantially an entire second side of the transport carrier 112 opposing the first side. The portion 152c may cover the entire bottom of the transport carrier 112. Other example implementations of the sealing component 152 having three portions may be used with the docking device 108.

As indicated above, FIGS. 2A-2F are provided as examples. Other examples may differ from what is described with regard to FIGS. 2A-2F. In some implementations, the sealing component 152 may include five or more portions in various configurations different from those described herein.

Figure 3:
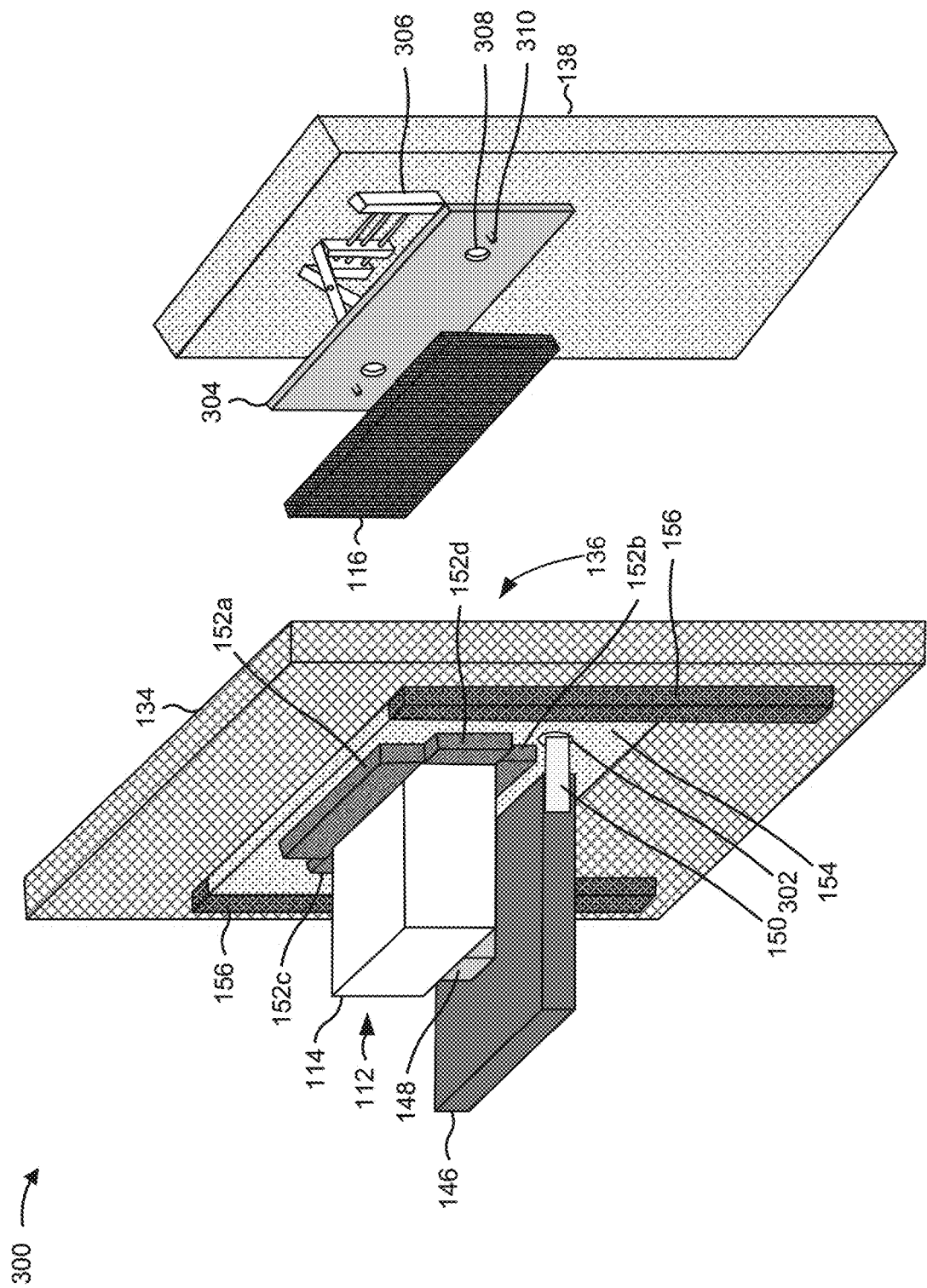
FIG. 3 is a diagram of portion of the example semiconductor processing environment of FIG. 1, described herein.

FIG. 3 is a diagram of portion 300 of the example semiconductor processing environment 100 of FIG. 1, described herein. As shown in FIG. 3, the portion 300 may include the divider wall 134, the chamber door 138, a moveable platform 146, a shuttle tray 148, one or more latches 150, the sealing component 152, the moveable frame 154, and the track(s) 156.

The divider wall 134 may include an elongated body in which the opening 136 is included. The track(s) 156 may be attached, connected, and/or otherwise mounted to a side of the elongated body of the divider wall 134. The moveable frame 154 may be mounted to and/or interfaced with the track(s) 156. The moveable frame 154 may include a substantially planar body that permits the moveable frame 154 to move along the track(s) 156 substantially parallel to the elongated body of the divider wall 134.

The sealing component 152 may include a plurality of portions, such as portion 152a, portion 152b, portion 152c, and portion 152d. The sealing component 152 (or the portions thereof) may be attached, connected, and/or otherwise mounted to a side of the elongated body of the moveable frame 154, such as the side of the elongated body of the moveable frame 154 opposing the side of the elongated body of the moveable frame 154 that is orientated and/or facing toward the divider wall 134. The sealing component 152 may be attached, connected, and/or otherwise mounted to the moveable frame 154 in a manner that permits the portions of the sealing component 152 to expand and contract between a first position 240 and a second position 250 to form or release an air-seal around a transport carrier 112.

The body 114 of the transport carrier 112 may be positioned on the shuttle tray 148 above the moveable platform 146. The one or more latches 150 of the moveable platform 146 may extend away from the moveable platform 146 and toward the moveable frame 154. The one or more latches 150 include one or more tabs, hooks, pins, or other structures that connect with one or more connectors 302 included on the moveable frame 154. With the one or more latches 150 connected with the one or more connectors 302, movement of the moveable platform 146 may cause the moveable frame 154 to move along the track(s) 156.

As further shown in FIG. 3, the portion 300 may include the chamber door 138. The chamber door 138 may include an elongated body that is substantially parallel to the elongated body of the divider wall 134. Moreover, the chamber door 138 may include a mounting plate 304 attached, connected, and/or otherwise mounted to a support structure 306. The support structure 306 may be attached, connected, and/or otherwise mounted to the elongated body of the chamber door 138. The mounting plate 304 and the support structure 306 may be attached, connected, and/or otherwise mounted to a side of the elongated body of the chamber door 138 that faces the divider wall 134. In this way, the mounting plate 304 faces the opening 136 in the divider wall 134. In particular, the mounting plate and the support structure 306 may be mounted to the side of the chamber door 138 that faces the side of the divider wall 134 that opposes the side of the divider wall 134 on which the track(s) 156, the moveable frame 154, and the sealing component 152 are mounted.

The mounting plate 304 may be configured to remove a carrier door 116 from the body 114 of the transport carrier 112. The mounting plate 304 may be configured to hold and/or support the carrier door 116 when the chamber door 138 moves between the closed position and the open position. The mounting plate 304 may be configured to place the carrier door 116 onto the body 114 of the transport carrier 112. The mounting plate 304 may include one or more vacuum holes 308 and one or more latch keys 310. The vacuum holes 308 may be connected to tube(s), plumbing fixture(s), and/or one or more other components that are configured to pull air through the vacuum holes 308 to form a negative pressure on the face of the mounting plate 304 near the vacuum holes 308. The negative pressure may form a suction or a vacuum seal between the mounting plate 304 and the carrier door 116. The mounting plate 304 may hold and/or support the carrier door 116 based on the negative pressure generated through the vacuum holes 308.

The latch key(s) 310 may be configured to unlatch the carrier door 116 from the body 114 of the transport carrier 112. For example, the latch key(s) 310 may include a key, an elongated member, or another component that is configured to open a door latch and/or a door lock on the carrier door 116. In some implementations, the mounting plate 304 includes a single latch key 310 (e.g., on a side of the mounting plate 304 or substantially near a center of the mounting plate 304). In some implementations, the mounting plate 304 includes a plurality of latch keys 310 substantially near one or more edges of the mounting plate 304.

The support structure 306 may include a jack (e.g., a scissor jack, a hydraulic jack, a pneumatic jack, or another type of jack), a screw mechanism, a rail system, or another type of structure configured to extend the mounting plate 304 away from the elongated body of the chamber door 138 and contract the mounting plate 304 toward the elongated body of the chamber door 138. In this way, the support structure 306 may extend the mounting plate 304 toward and/or through the opening 136 in the divider wall 134 to remove the carrier door 116 from the transport carrier 112, may contract the mounting plate 304 after removing the carrier door 116 so that the chamber door 138 may be moved to the opened position, and may extend the mounting plate 304 toward transport carrier 112 to place the carrier door 116 onto the transport carrier 112.

As indicated above, FIG. 3 is provided as an example. Other examples may differ from what is described with regard to FIG. 3.

Figure 4A:
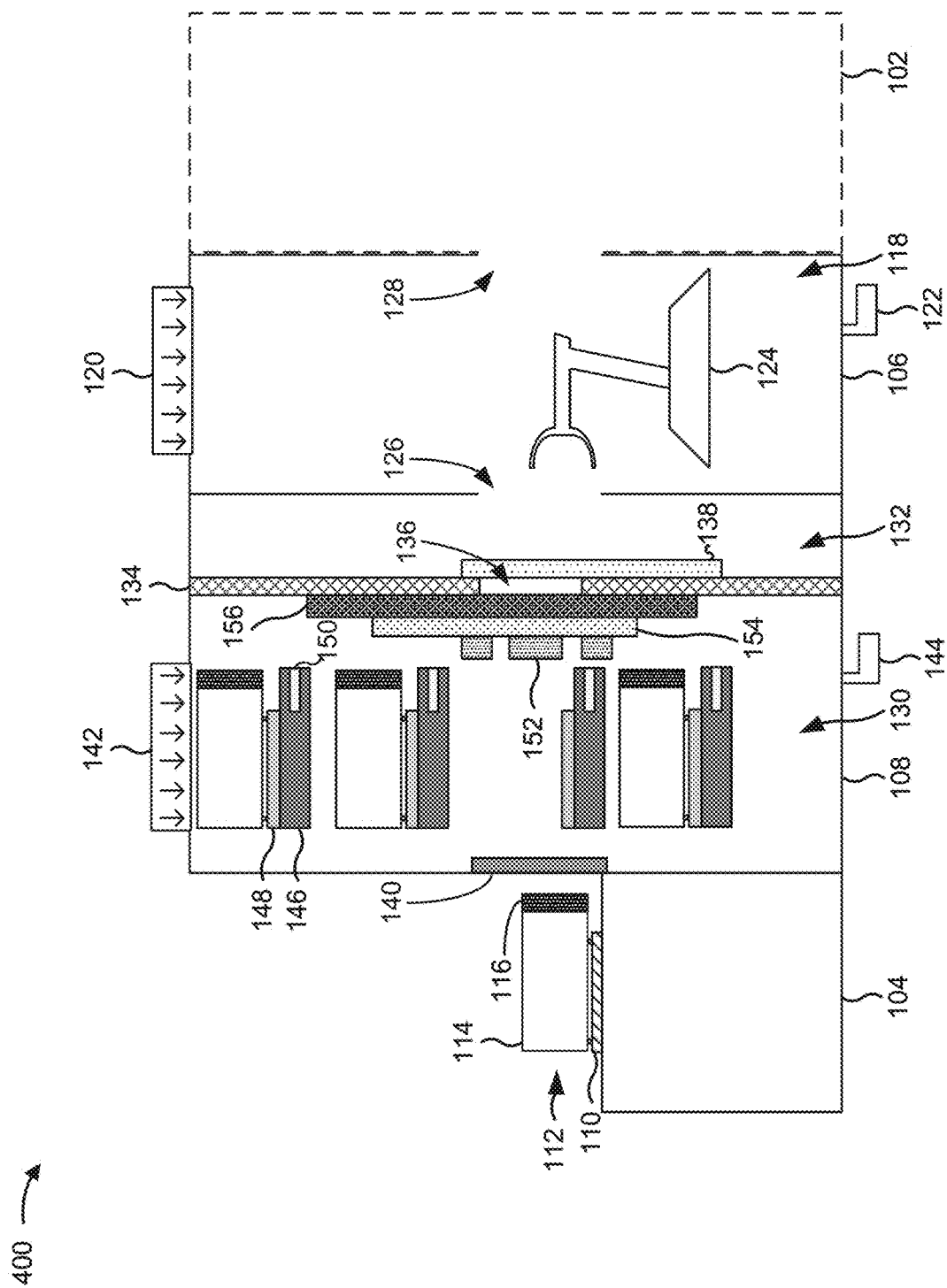
FIGS. 4A-4K are diagrams of one or more example implementations described herein.

FIGS. 4A-4K are diagrams of one or more example implementations 400 described herein. The example implementation(s) 400 may include one or more example implementations illustrating various operations of the docking device 108 and other tools included in the example semiconductor processing environment 100. As shown in FIG. 4A, a transport carrier 112 may be placed on the shuttle platform 110 of the load port 104. For example, a mobile robot, an OHT, or another transport tool may place the transport carrier 112 on the shuttle platform 110.

Figure 4B:
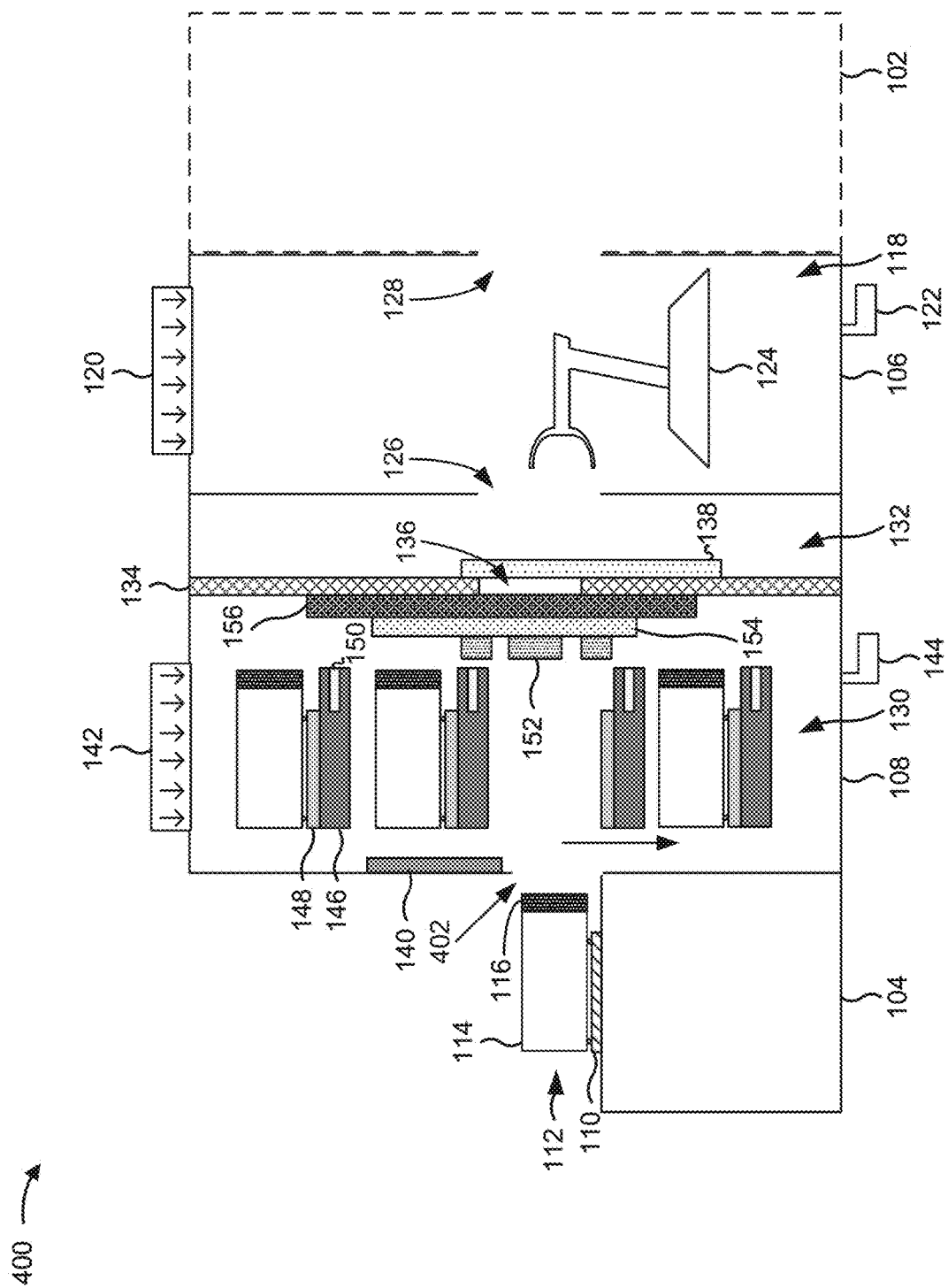

As shown in FIG. 4B, the door 140 on the side of the first chamber 130 may be opened to provide access to the docking device 108 through an opening 402 in the first chamber 130. As further shown in FIG. 4B, the moveable platforms 146 may move (e.g., downward in the first chamber 130) to align an empty moveable platform 146 with the opening 402 in preparation for the transport carrier 112 on the shuttle platform 110 to be placed on the empty moveable platform 146.

Figure 4C:
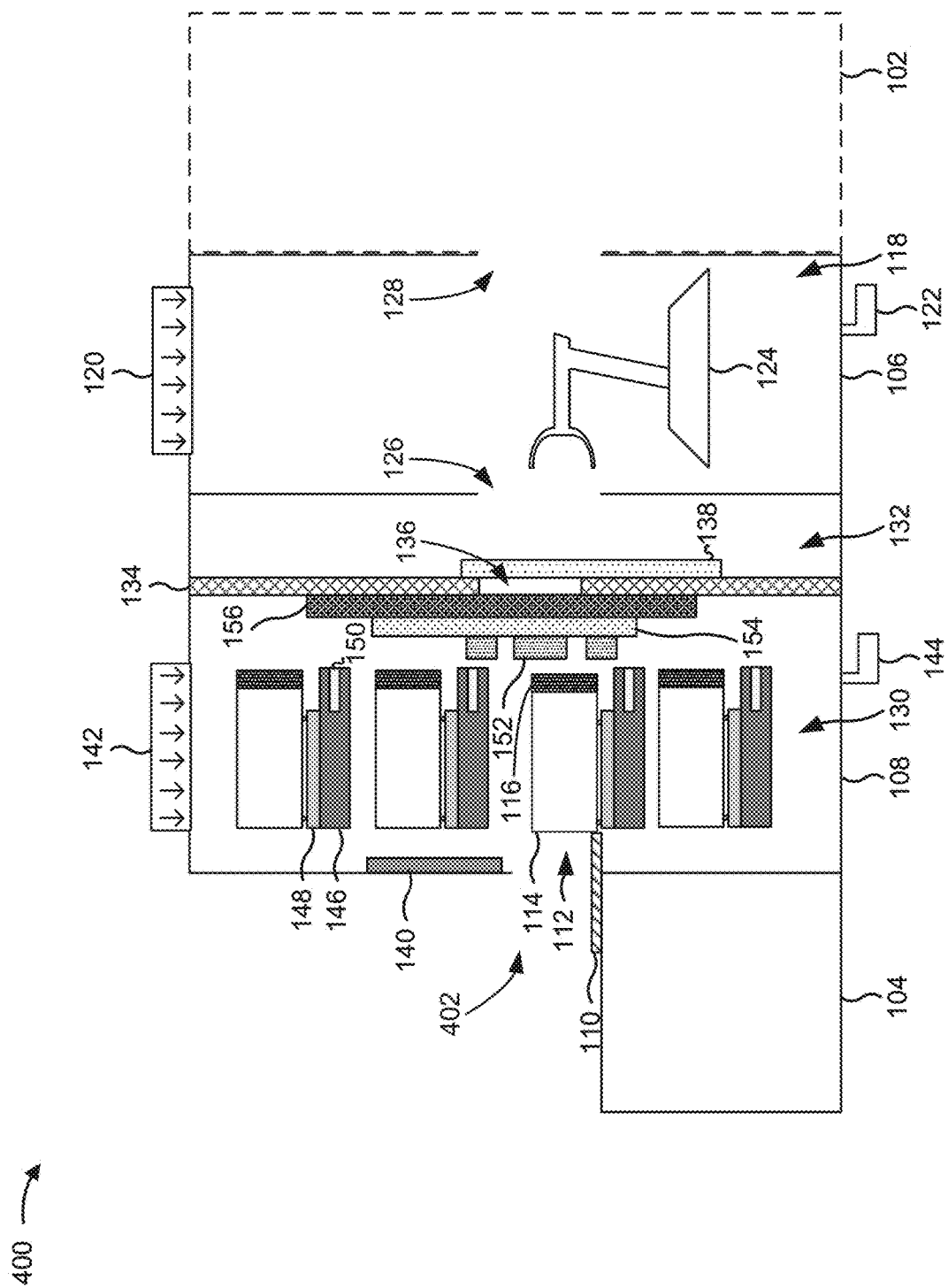

As shown in FIG. 4C, the shuttle platform 110 may slide or otherwise move toward the opening 402 in the first chamber 130 such that the transport carrier 112 is fully inserted into the first chamber 130 through the opening 402 and placed on the empty moveable platform 146. In particular, the transport carrier 112 may be placed on the shuttle tray 148 of the empty moveable platform 146. In some implementations, the door 140 may be moved to close the opening 402 after the transport carrier 112 is placed on the empty moveable platform 146. In some implementations, the door 140 may remain in place such that the opening 402 remains cleared after the transport carrier 112 is placed on the empty moveable platform 146.

Figure 4D:
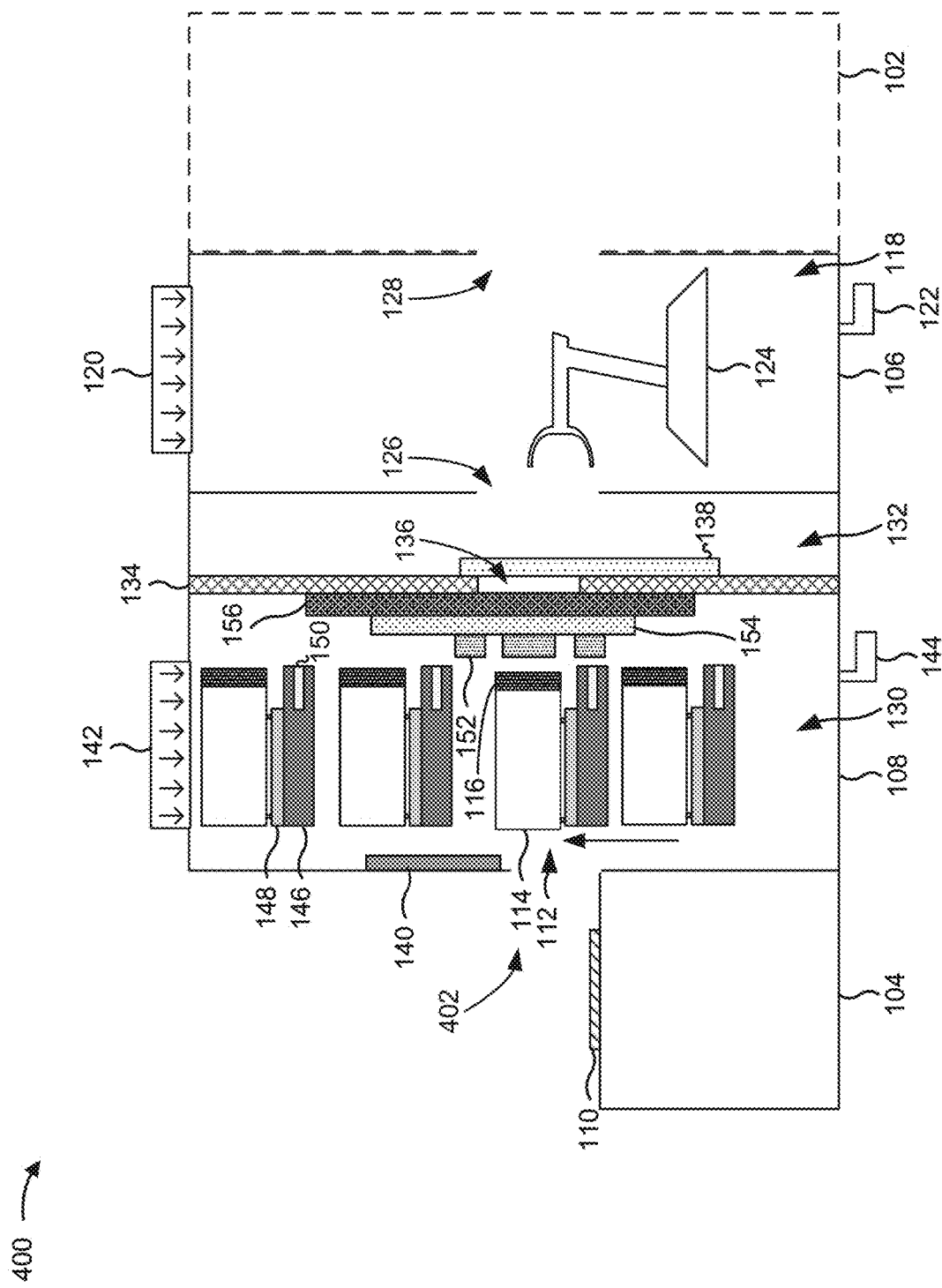

As shown in FIG. 4D, the moveable platforms 146 may move (e.g., upward in the first chamber 130) to align the transport carrier 112 with the sealing component 152 and/or the opening in the moveable frame 154 in preparation for the transport carrier 112 to be accessed by the wafer transport tool 124.

Figure 4E:
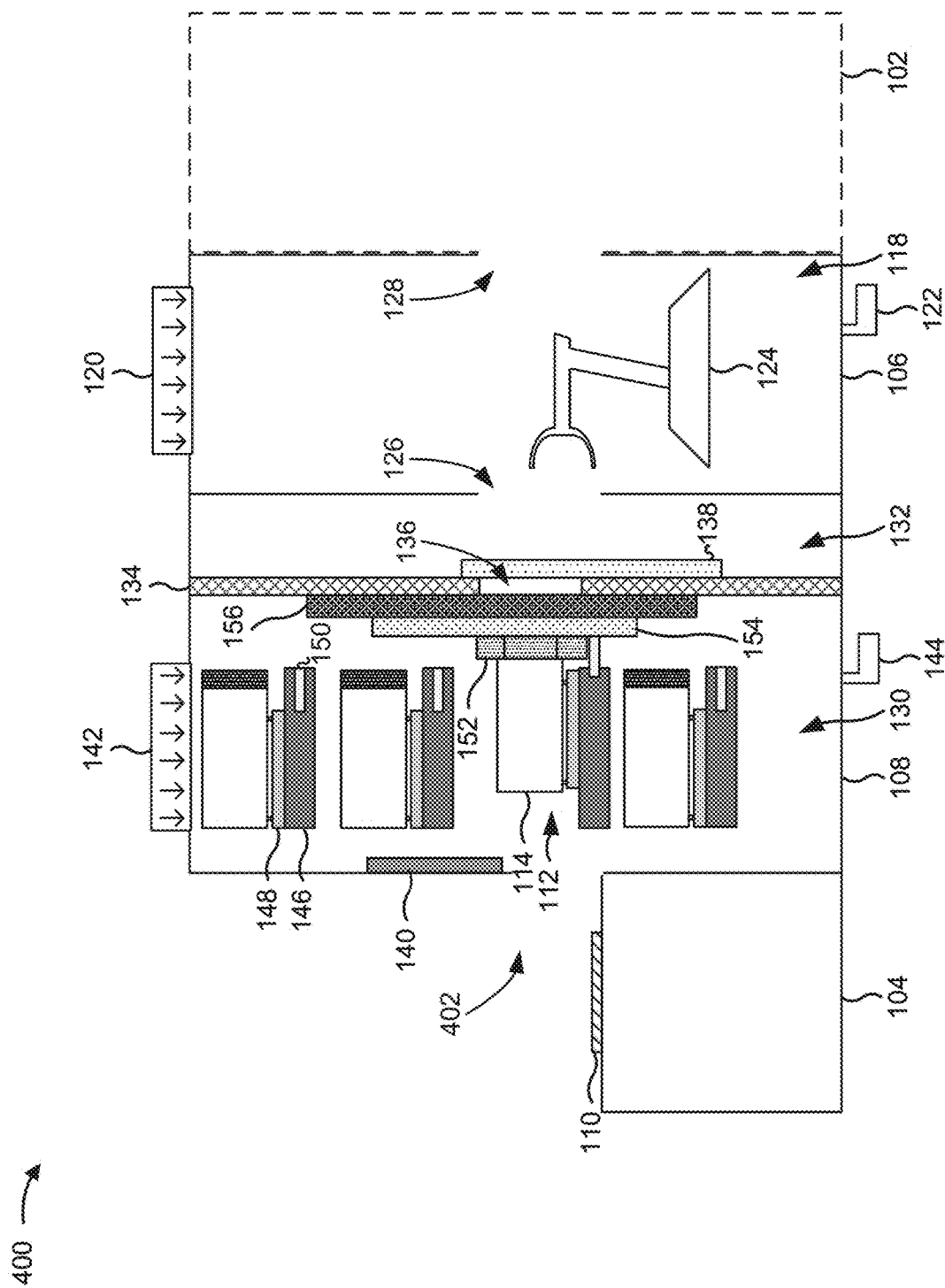

As shown in FIG. 4E, with the transport carrier 112 aligned with the sealing component 152 and/or the opening in the moveable frame 154, the shuttle tray 148 may slide or otherwise extend toward the sealing component 152 such that the carrier door 116 is placed at least partially through the opening in the moveable frame 154, and such that portions of the sealing component 152 are around the body 114 of the transport carrier 112.

Moreover, the one or more latches 150, of the moveable platform 146 on which the transport carrier 112 is positioned, may extend away from the moveable platform 146 and toward the moveable frame 154. The one or more latches 150 may connect with one or more connectors 302 of the moveable frame 154 to permit the movement of the moveable platform 146 to cause the moveable frame 154 to move in synchronization with the moveable platform 146.

With the portions of the sealing component 152 around a portion of the body 114, the sealing component 152 may contract around the transport carrier 112 to form an air-tight seal around the body 114 of the transport carrier 112. In particular, the air-tight seal may be formed between the sealing component 152 and the transport carrier 112. In this way, the area around the transport carrier 112 is sealed to reduce, minimize, and/or eliminate the flow of contaminants from the example semiconductor processing environment 100 through the opening in the moveable frame 154 and the opening 136 in the divider wall 134, and into the second chamber 132. The portions of the sealing component 152 may transition from a first position 240 (e.g., corresponding to an expanded configuration) to a second position 250 (e.g., corresponding to a contracted configuration) to form the air-tight seal around the body 114 of the transport carrier 112.

Figure 4F:
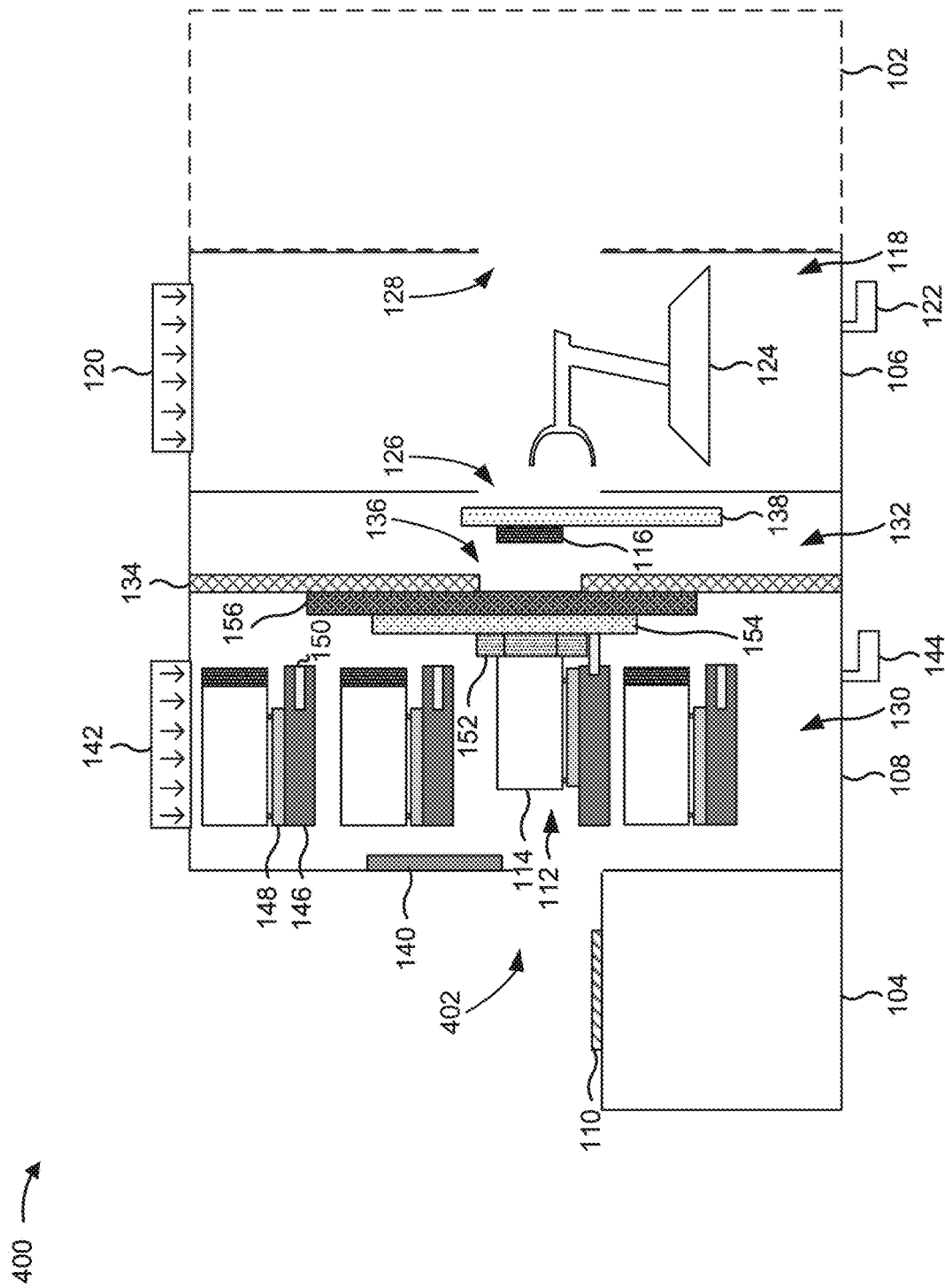

As shown in FIG. 4F, with the air-tight seal formed around the transport carrier 112 by the sealing component 152, the chamber door 138 may remove the carrier door 116 from the transport carrier 112. For example, the support structure 306 may extend the mounting plate 304 toward the carrier door 116 through the opening 136 in the divider wall 134. The one or more latch keys 310 on the mounting plate 304 may unlatch the carrier door 116 from the body 114 of the transport carrier 112. The vacuum holes 308 on the mounting plate 304 may form a vacuum seal between the carrier door 116 and the mounting plate 304. With the vacuum seal formed, the support structure 306 may contract the mounting plate 304 (with the carrier door 116 supported and/or held thereon) toward the chamber door 138.

As further shown in FIG. 4F, the chamber door 138 may slide and/or otherwise move backward away from the divider wall 134 and toward the opening 126, which removes the air-tight seal between divider wall 134 and the chamber door 138. In particular, the chamber door 138 may slide and/or otherwise move backward away from the divider wall 134 and toward the opening 126 after removing the carrier door 116 from the transport carrier 112 and contracting the mounting plate 304 toward the chamber door 138. The chamber door 138 may slide and/or otherwise move backward away from the divider wall 134 a sufficient distance to permit the carrier door 116 to clear the divider wall 134 when the chamber door 138 slides and/or otherwise moves downward into the second chamber 132.

Figure 4G:
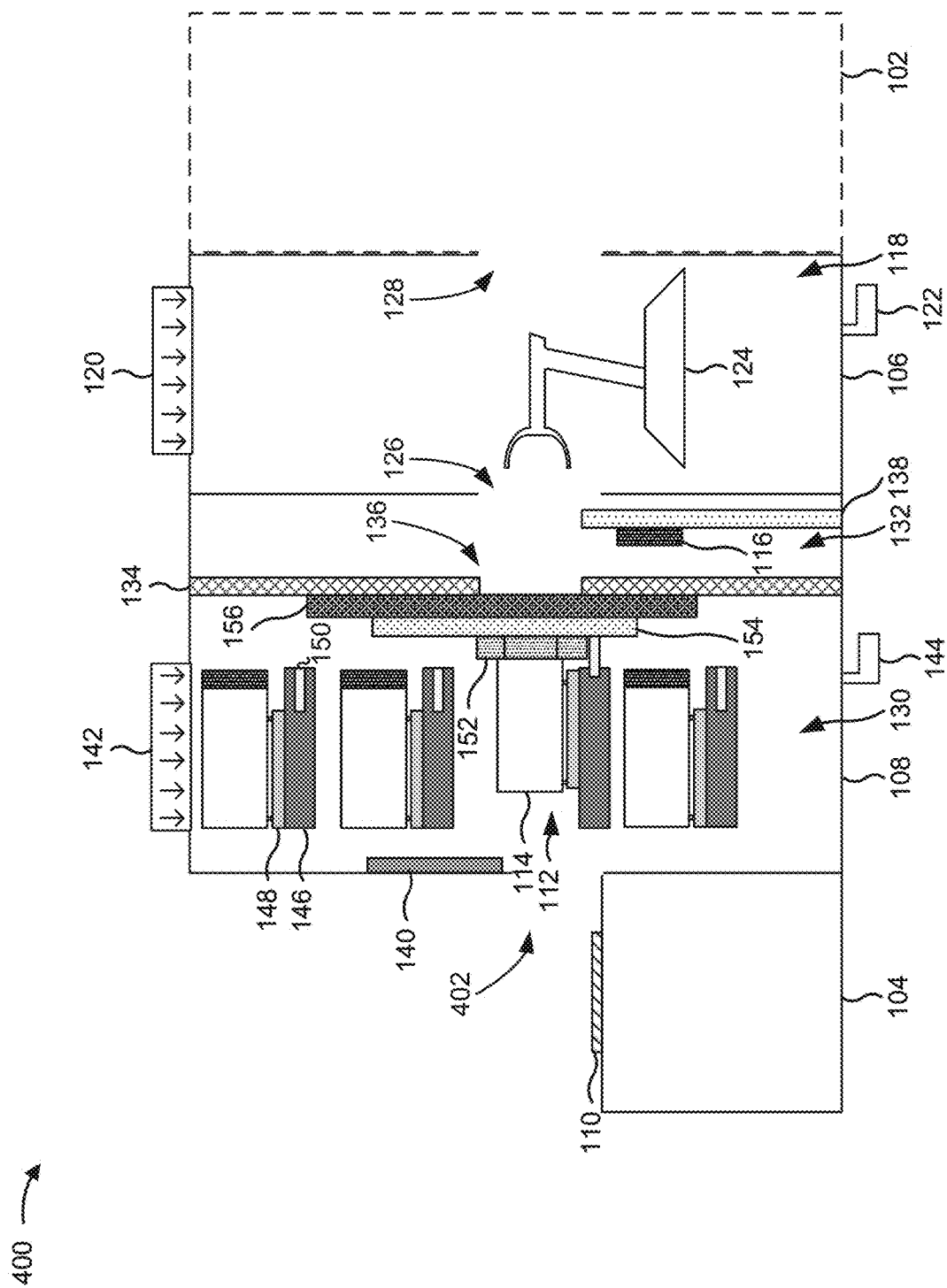

As shown in FIG. 4G, the chamber door 138 may slide and/or otherwise move out of the way of the opening 136 in the divider wall 134 such that the wafer transport tool 124 is permitted to access the transport carrier 112 through the opening 136 in the divider wall 134. In some implementations, the chamber door 138 slides and/or otherwise moves downward within the second chamber 132. In some implementations, the chamber door 138 slides and/or otherwise moves upward within the second chamber 132. In some implementations, the chamber door 138 slides and/or otherwise moves to a side within the second chamber 132. In some implementations, the chamber door 138 slides and/or otherwise moves in a combination of directions within the second chamber 132.

Figure 4H:
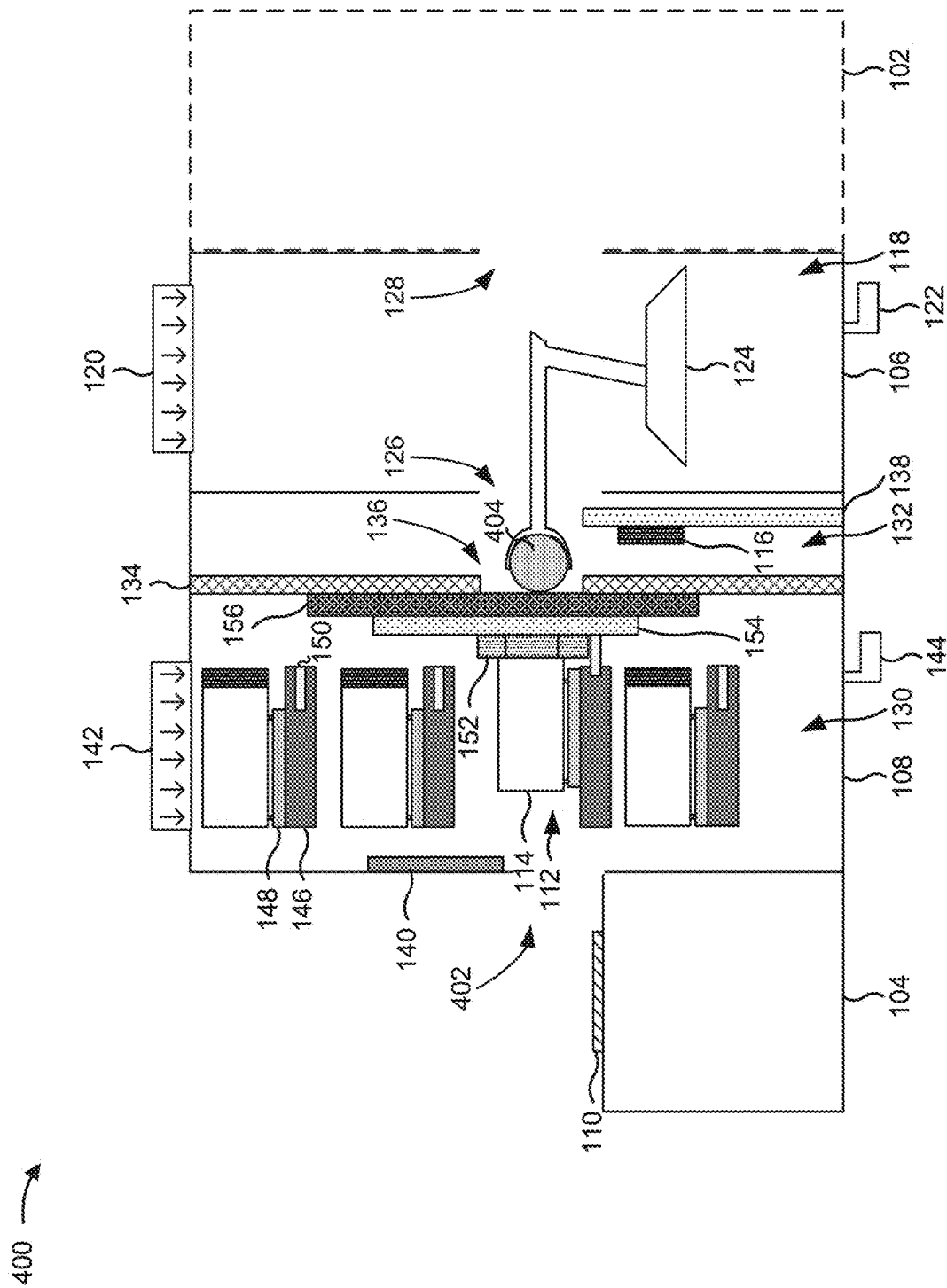
Figure 4I:
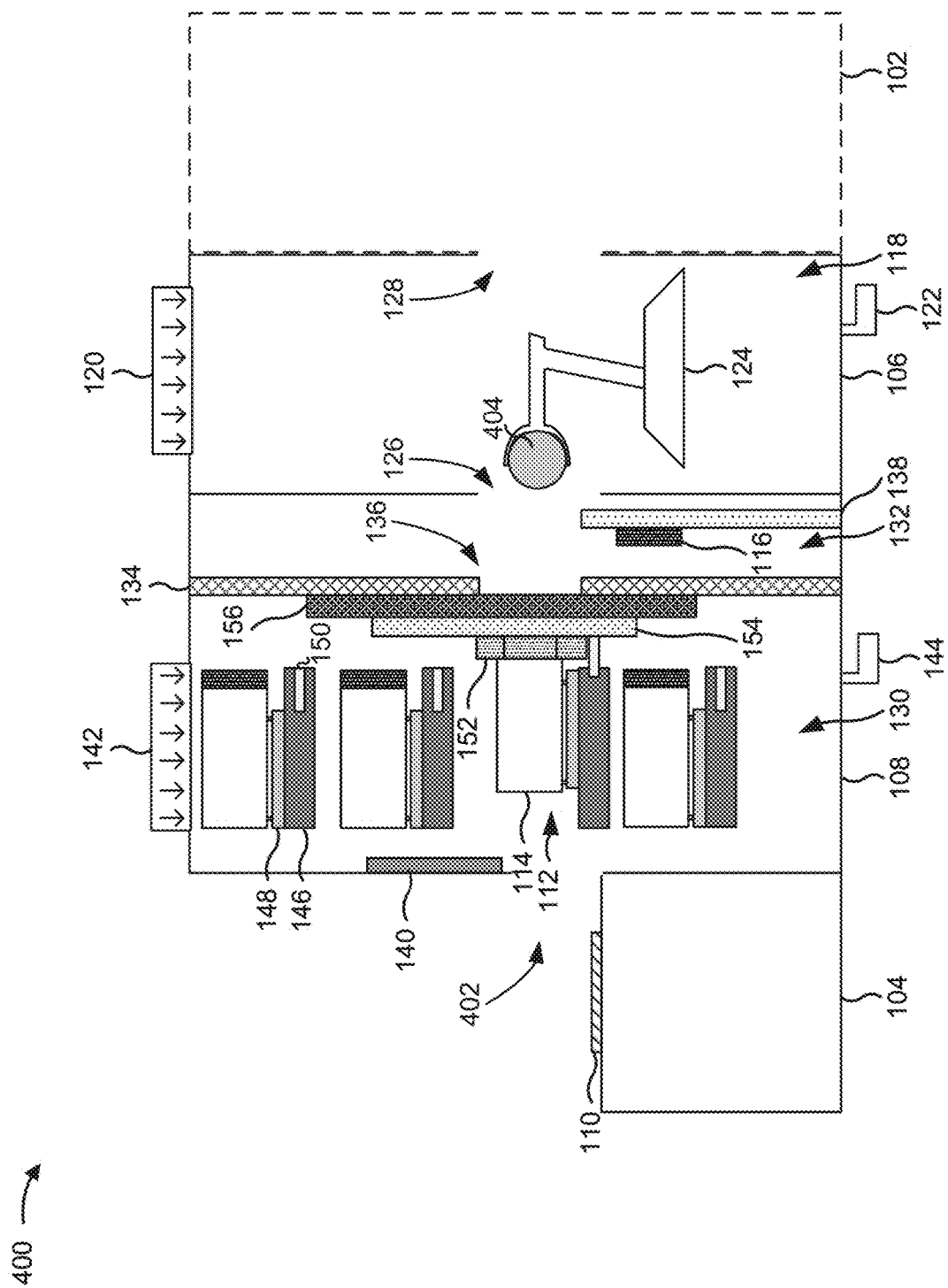
Figure 4J:
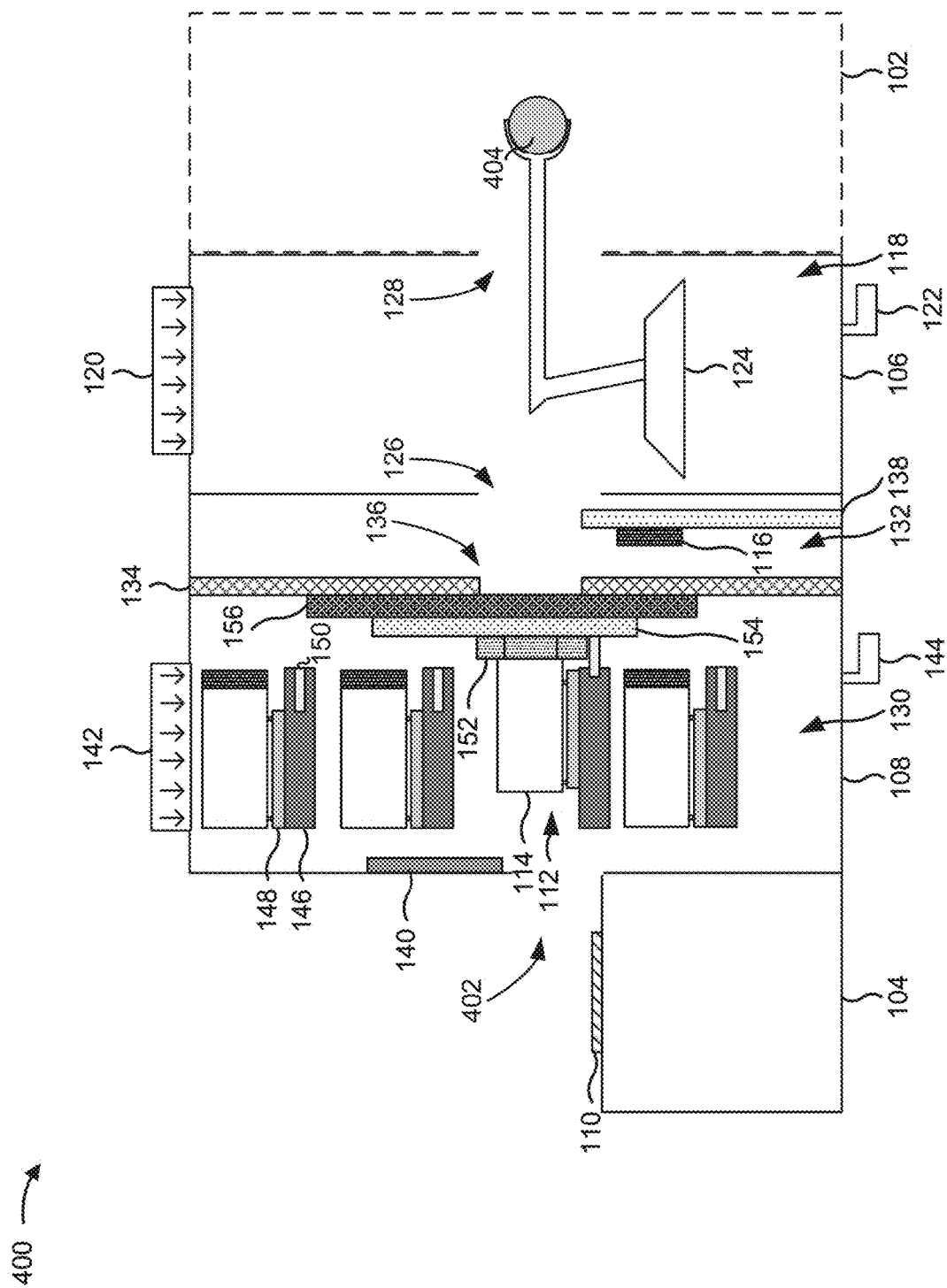

As shown in FIG. 4H, the wafer transport tool 124 of the interface tool 106 may retrieve and/or obtain a wafer 404 from the transport carrier 112 through the opening 136 in the divider wall 134 and through the opening 126. In this way, the wafer transport tool 124 retrieves and/or obtains the wafer 404 from the transport carrier 112 while the air-tight seal is formed around the transport carrier 112 by the sealing component 152. As shown in FIG. 4I, the wafer transport tool 124 may retract the wafer 404 through the opening 136 in the divider wall 134 and through the opening 126 into the chamber 118 of the interface tool 106. As shown in FIG. 4J, the wafer transport tool 124 may provide the wafer 404 to the semiconductor processing tool 102 through the opening 128. The wafer 404 may be processed by the semiconductor processing tool 102 through one or more semiconductor processing operations. The operations described above may be performed in a reverse order to place the wafer 404 back into the transport carrier 112.

Figure 4K:
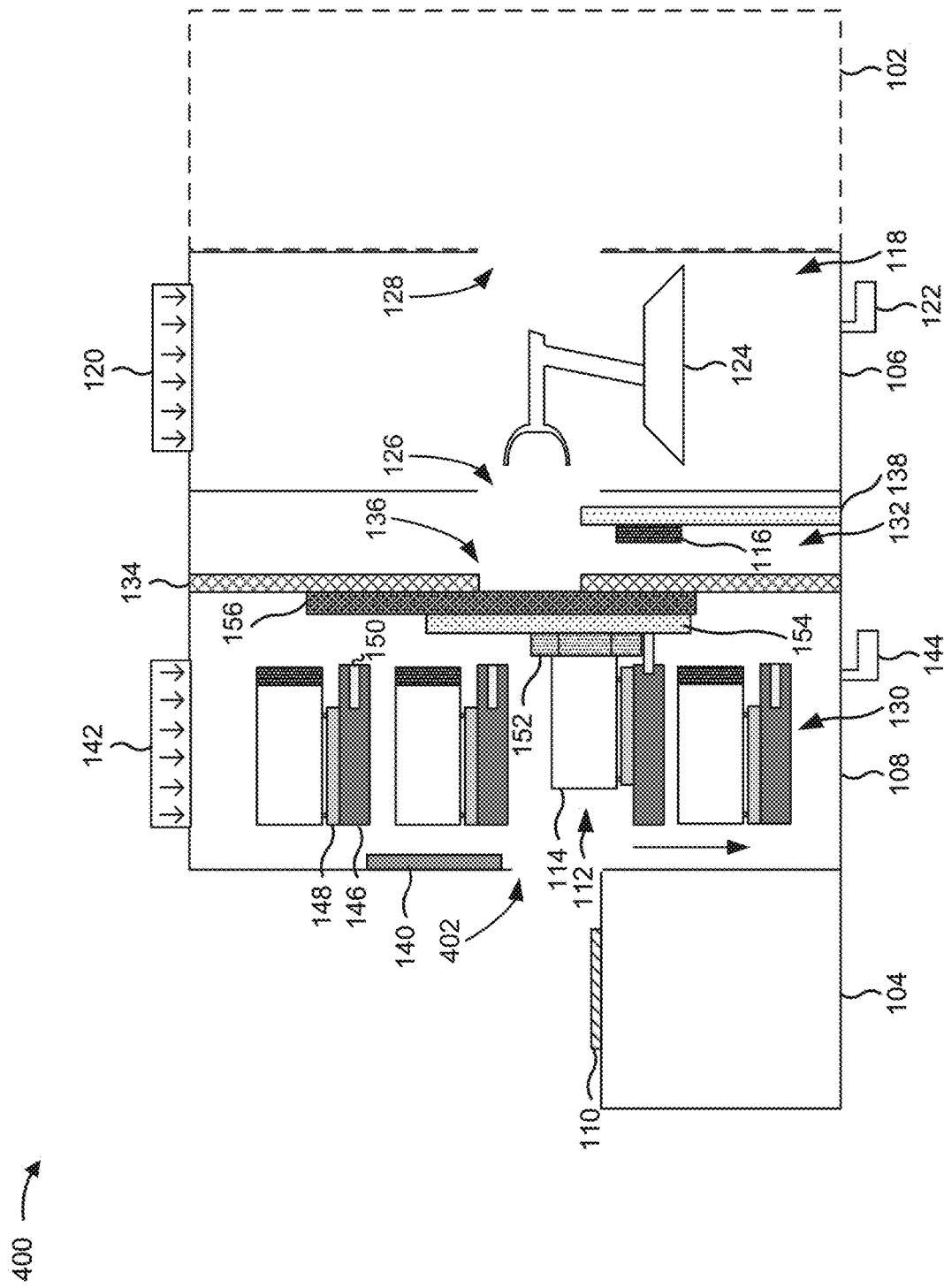

As shown in FIG. 4K, the moveable platforms 146 may move in the first chamber 130 while the carrier door 116 of the transport carrier 112 is removed. This may permit other transport carriers 112 to be removed from the first chamber 130 and/or to permit other transport carriers 112 to be added to the first chamber 130 while semiconductor wafers of the transport carrier 112 are being processed by the semiconductor processing tool 102. This may further increase the efficiency and throughput of the semiconductor processing tool 102 and/or the efficiency and throughput of the docking device 108, as the docking device 108 may continue to be loaded and unloaded without stopping the productivity of the semiconductor processing tool 102.

As indicated above, FIGS. 4A-4K are provided as examples. Other examples may differ from what is described with regard to FIGS. 4A-4K.

Figure 5:
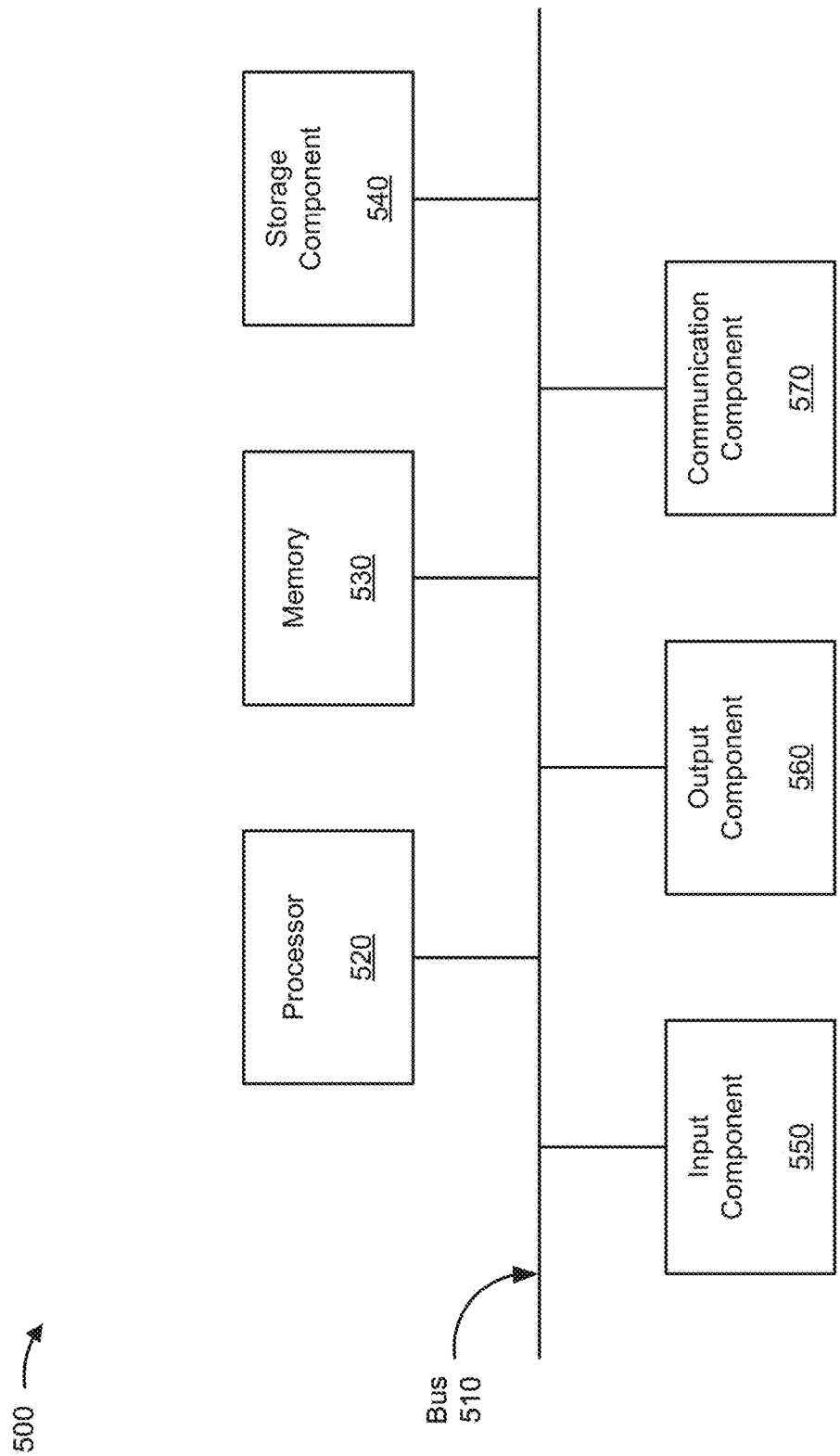
FIG. 5 is a diagram of example components of one or more devices of FIG. 2.

FIG. 5 is a diagram of example components of a device 500. In some implementations, one or more devices and/or tools of the example semiconductor processing environment 100 (e.g., the semiconductor processing tool 102, the load port 104, the interface tool 106, and/or the multiple transport carrier docking device 108) may include one or more devices 500 and/or one or more components of device 500. As shown in FIG. 5, device 500 may include a bus 510, a processor 520, a memory 530, a storage component 540, an input component 550, an output component 560, and a communication component 570.

Bus 510 includes a component that enables wired and/or wireless communication among the components of device 500. Processor 520 includes a central processing unit, a graphics processing unit, a microprocessor, a controller, a microcontroller, a digital signal processor, a field-programmable gate array, an application-specific integrated circuit, and/or another type of processing component. Processor 520 is implemented in hardware, firmware, or a combination of hardware and software. In some implementations, processor 520 includes one or more processors capable of being programmed to perform a function. Memory 530 includes a random access memory, a read only memory, and/or another type of memory (e.g., a flash memory, a magnetic memory, and/or an optical memory).

Storage component 540 stores information and/or software related to the operation of device 500. For example, storage component 540 may include a hard disk drive, a magnetic disk drive, an optical disk drive, a solid state disk drive, a compact disc, a digital versatile disc, and/or another type of non-transitory computer-readable medium. Input component 550 enables device 500 to receive input, such as user input and/or sensed inputs. For example, input component 550 may include a touch screen, a keyboard, a keypad, a mouse, a button, a microphone, a switch, a sensor, a global positioning system component, an accelerometer, a gyroscope, and/or an actuator. Output component 560 enables device 500 to provide output, such as via a display, a speaker, and/or one or more light-emitting diodes. Communication component 570 enables device 500 to communicate with other devices, such as via a wired connection and/or a wireless connection. For example, communication component 570 may include a receiver, a transmitter, a transceiver, a modem, a network interface card, and/or an antenna.

Device 500 may perform one or more processes described herein. For example, a non-transitory computer-readable medium (e.g., memory 530 and/or storage component 540) may store a set of instructions (e.g., one or more instructions, code, software code, and/or program code) for execution by processor 520. Processor 520 may execute the set of instructions to perform one or more processes described herein. In some implementations, execution of the set of instructions, by one or more processors 520, causes the one or more processors 520 and/or the device 500 to perform one or more processes described herein. In some implementations, hardwired circuitry may be used instead of or in combination with the instructions to perform one or more processes described herein. Thus, implementations described herein are not limited to any specific combination of hardware circuitry and software.

The number and arrangement of components shown in FIG. 5 are provided as an example. Device 500 may include additional components, fewer components, different components, or differently arranged components than those shown in FIG. 5. Additionally, or alternatively, a set of components (e.g., one or more components) of device 500 may perform one or more functions described as being performed by another set of components of device 500.

Figure 6:
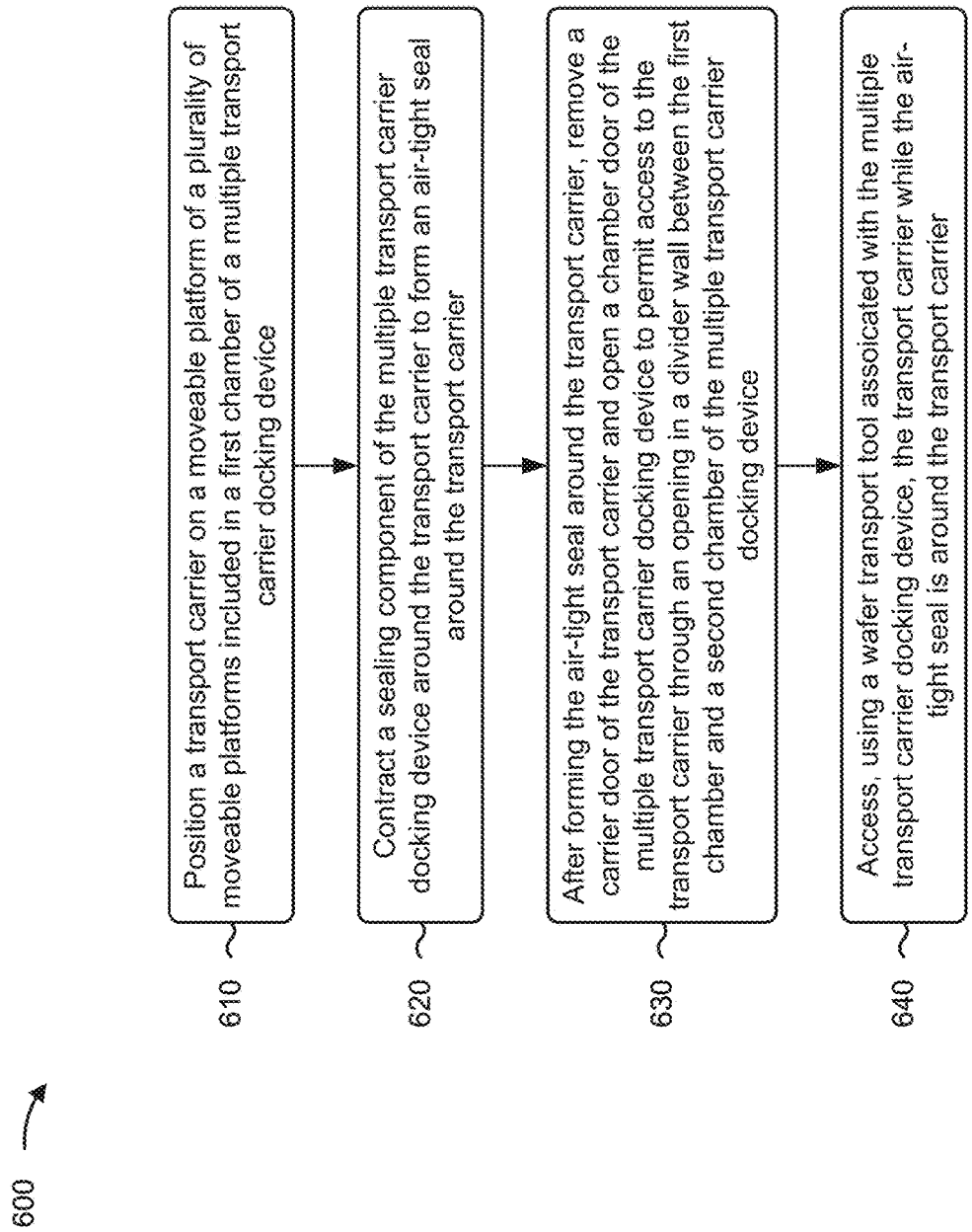
FIGS. 6 and 7 are flowcharts of example processes relating to accessing a transport carrier.

FIG. 6 is a flowchart of an example process 600 associated with accessing a transport carrier. In some implementations, one or more process blocks of FIG. 6 may be performed by a multiple transport carrier docking device (e.g., the multiple transport carrier docking device 108). In some implementations, one or more process blocks of FIG. 6 may be performed by another device or a group of devices separate from or including the multiple transport carrier docking device, such as a semiconductor processing tool 102, a load port 104, an interface tool 106, and/or another device. Additionally, or alternatively, one or more process blocks of FIG. 6 may be performed by one or more components of device 500, such as processor 520, memory 530, storage component 540, input component 550, output component 560, and/or communication component 570.

As shown in FIG. 6, process 600 may include positioning a transport carrier on a moveable platform of a plurality of moveable platforms included in a first chamber of a multiple transport carrier docking device (block 610). For example, the load port 104 (e.g., using the shuttle platform 110) may position the transport carrier 112 on a moveable platform 146 of a plurality of moveable platforms 146 included in the first chamber 130 of the multiple transport carrier docking device 108, as described above.

As further shown in FIG. 6, process 600 may include contracting a sealing component of the multiple transport carrier docking device around the transport carrier to form an air-tight seal around the transport carrier (block 620). For example, the multiple transport carrier docking device 108 may contract the sealing component 152 of the multiple transport carrier docking device 108 around the transport carrier 112 to form an air-tight seal around the transport carrier 112, as described above.

As further shown in FIG. 6, process 600 may include, after forming the air-tight seal around the transport carrier, removing a carrier door of the transport carrier and opening a chamber door of the multiple transport carrier docking device to permit access to the transport carrier through an opening in a divider wall between the first chamber and a second chamber of the multiple transport carrier docking device (block 630). For example, the multiple transport carrier docking device 108 may, after forming the air-tight seal around the transport carrier 112, remove the carrier door 116 of the transport carrier 112 and may open the chamber door 138 of the multiple transport carrier docking device 108 to permit access to the transport carrier 112 through the opening 136 in the divider wall 134 between the first chamber 130 and the second chamber 132 of the multiple transport carrier docking device 108, as described above.

As further shown in FIG. 6, process 600 may include accessing, using a wafer transport tool with the multiple transport carrier docking device, the transport carrier while the air-tight seal is around the transport carrier (block 640). For example, the interface tool 106 may access, using the wafer transport tool 124 associated with the multiple transport carrier docking device 108, the transport carrier 112 while the air-tight seal is around the transport carrier 112, as described above.

Process 600 may include additional implementations, such as any single implementation or any combination of implementations described below and/or in connection with one or more other processes described elsewhere herein.

In a first implementation, accessing the transport carrier 112 includes retrieving a wafer 404 from the transport carrier 112 through the opening 136 and through the second chamber 132 while the air-tight seal is around the transport carrier 112, and providing the wafer 404 to a semiconductor processing tool 102. In a second implementation, alone or in combination with the first implementation, process 600 includes sliding, using a shuttle tray 148 on the moveable platform, 146 the transport carrier 112 toward the sealing component 152, and contracting the sealing component 152 around the transport carrier 112 to form the air-tight seal around the transport carrier 112 includes contracting the sealing component 152 around the transport carrier 112 to form the air-tight seal around the transport carrier 112 after sliding the transport carrier toward 112 the sealing component 152.

In a third implementation, alone or in combination with one or more of the first and second implementations, process 600 includes extending a latch 150 of the moveable platform 146 toward a moveable frame 154 to which the sealing component 152 is mounted, and inserting the latch 150 into a connector 302 on the moveable frame 154, and moving the moveable platform 146 while the latch 150 is inserted into the connector 302. In a fourth implementation, alone or in combination with one or more of the first through third implementations, moving the moveable platform 146 while the latch 150 is inserted into the connector 302 causes the moveable frame 154 to move along with the moveable platform 146.

In a fifth implementation, alone or in combination with one or more of the first through fourth implementations, moving the moveable platform 146 while the latch 150 is inserted into the connector 302 includes moving the moveable platform 146 while the latch 150 is inserted into the connector 302 to orientate the transport carrier 112 in front of the opening 136 in the divider wall 134. In a sixth implementation, alone or in combination with one or more of the first through fifth implementations, removing the carrier door 116 of the transport carrier 112 includes pressing a mounting plate 304, attached to the chamber door 138, against the carrier door 116, unlatching, using a latch key 310 included on the mounting plate 304, the carrier door 116 from a body 114 of the transport carrier 112, forming a vacuum seal between the mounting plate 304 and the carrier door 116, and retracting the mounting plate 304 toward the chamber door 138 while the vacuum seal is between the mounting plate 304 and the carrier door 116.

Although FIG. 6 shows example blocks of process 600, in some implementations, process 600 may include additional blocks, fewer blocks, different blocks, or differently arranged blocks than those depicted in FIG. 6. Additionally, or alternatively, two or more of the blocks of process 600 may be performed in parallel.

Figure 7:
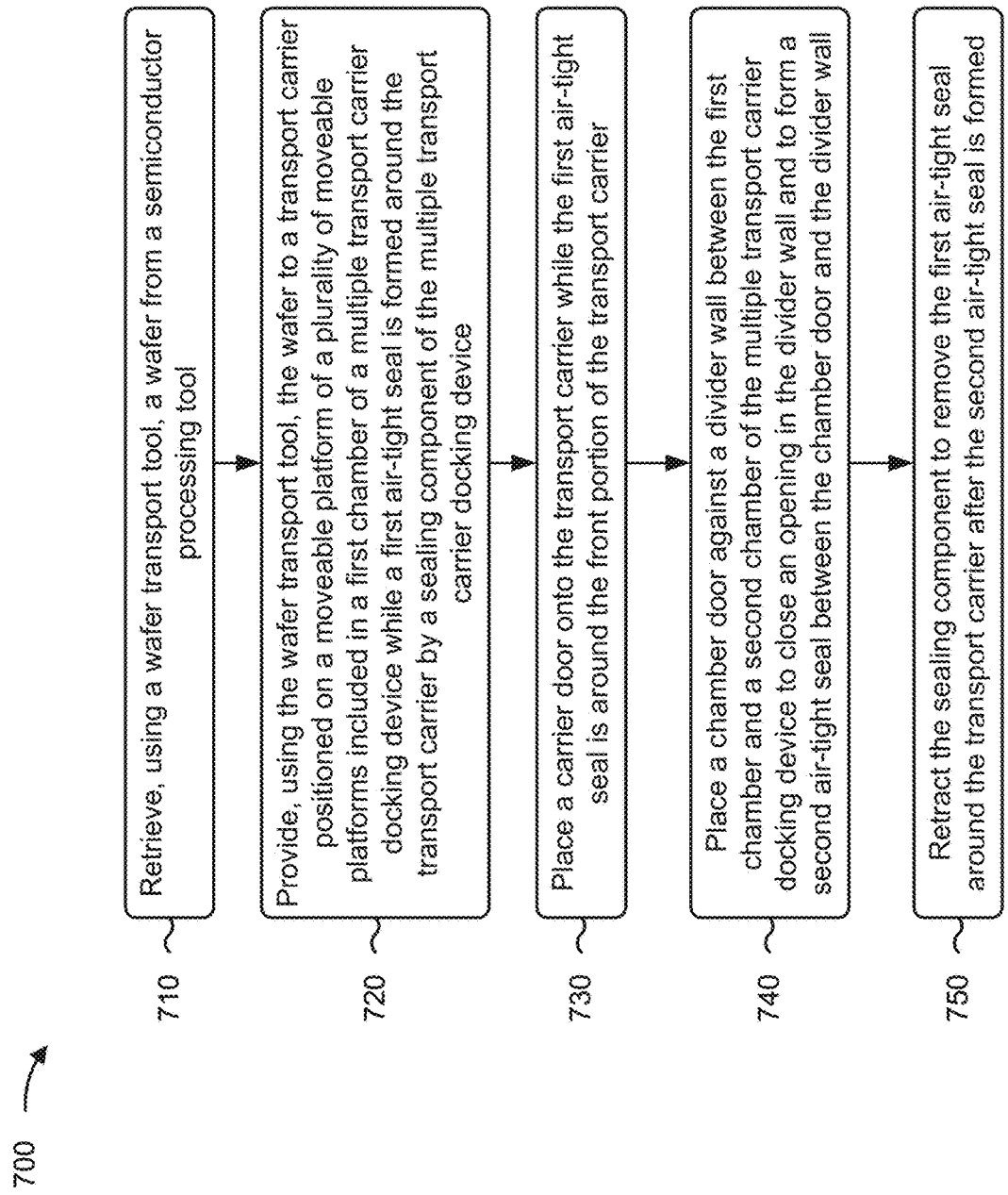

FIG. 7 is a flowchart of an example process 700 associated with accessing a transport carrier. In some implementations, one or more process blocks of FIG. 7 may be performed by a multiple transport carrier docking device (e.g., the multiple transport carrier docking device 108). In some implementations, one or more process blocks of FIG. 7 may be performed by another device or a group of devices separate from or including the multiple transport carrier docking device, such as a semiconductor processing tool 102, a load port 104, an interface tool 106, and/or another device. Additionally, or alternatively, one or more process blocks of FIG. 7 may be performed by one or more components of device 500, such as processor 520, memory 530, storage component 540, input component 550, output component 560, and/or communication component 570.

As shown in FIG. 7, process 700 may include retrieving, using a wafer transport tool, a wafer from a semiconductor processing tool (block 710). For example, the interface tool may retrieve, using the wafer transport tool 124, the wafer 404 from the semiconductor processing tool 102, as described above.

As further shown in FIG. 7, process 700 may include providing, using the wafer transport tool, the wafer to a transport carrier positioned on a moveable platform of a plurality of moveable platforms included in a first chamber of a multiple transport carrier docking device while a first air-tight seal is formed around the transport carrier by a sealing component of the multiple transport carrier docking device (block 720). For example, the interface tool 106 may provide, using the wafer transport tool 124, the wafer 404 to the transport carrier 112 positioned on the moveable platform 146 of the plurality of moveable platforms 146 included in the first chamber 130 of the multiple transport carrier docking device 108 while a first air-tight seal is formed around the transport carrier 112 by the sealing component 152 of the multiple transport carrier docking device 108, as described above.

As further shown in FIG. 7, process 700 may include placing a carrier door onto the transport carrier while the first air-tight seal is around the front portion of the transport carrier (block 730). For example, the multiple transport carrier docking device 108 may place (e.g., using the chamber door 138) the carrier door 116 onto the transport carrier 112 while the first air-tight seal is around the front portion of the transport carrier 112, as described above.

As further shown in FIG. 7, process 700 may include placing a chamber door against divider wall between the first chamber and a second chamber of the multiple transport carrier docking device to close an opening in the divider wall and to form a second air-tight seal between the chamber door and the divider wall (block 740). For example, the multiple transport carrier docking device 108 may place the chamber door 138 against the divider wall 134 between the first chamber 130 and the second chamber 132 of the multiple transport carrier docking device 108 to close the opening 136 in the divider wall 134 and to form a second air-tight seal between the chamber door 138 and the divider wall 134, as described above.

As further shown in FIG. 7, process 700 may include retracting the sealing component to remove the first air-tight seal around the transport carrier after the second air-tight seal is formed (block 750). For example, the multiple transport carrier docking device 108 may retract the sealing component 152 to remove the first air-tight seal around the transport carrier 112 after the second air-tight seal is formed, as described above.

Process 700 may include additional implementations, such as any single implementation or any combination of implementations described below and/or in connection with one or more other processes described elsewhere herein.

In a first implementation, process 700 includes moving the plurality of moveable platforms 146 in the first chamber 130 such that another transport carrier 112 on another movable platform 146 of the plurality of moveable platforms 146 is positioned in front of the opening 136 in the divider wall 134, contracting the sealing component 152 around the other transport carrier 112 to form a third air-tight seal around the other transport carrier 112, after forming the third air-tight seal around the other transport carrier 112 removing another carrier door 116 of the other transport carrier 112, and opening the chamber door 138 to remove the second air-tight seal to permit access to the other transport carrier 112 through the opening 136 in the divider wall 134, and accessing, using the wafer transport tool 124, the other transport carrier 112 while the third air-tight seal is around the other transport carrier 112.

Although FIG. 7 shows example blocks of process 700, in some implementations, process 700 may include additional blocks, fewer blocks, different blocks, or differently arranged blocks than those depicted in FIG. 7. Additionally, or alternatively, two or more of the blocks of process 700 may be performed in parallel.

In this way, a multiple transport carrier docking device may be positioned between a load port and an interface tool to reduce and/or minimize cross contamination of semiconductor wafers that are transferred between the load port and an associated semiconductor processing tool. The multiple transport carrier docking device may be capable of storing and/or staging a plurality of transport carriers in a chamber of the multiple transport carrier docking device, and may be capable of forming an air-tight seal around a transport carrier in the chamber. Semiconductor wafers in the transport carrier may be accessed by a transport tool while the air-tight seal around the transport carrier prevents and/or reduces the likelihood that contaminants in the semiconductor fabrication facility will reach the semiconductor wafers. The air-tight seal around the transport carrier may reduce defects of the semiconductor wafers that might otherwise be caused by the contaminants, may increase manufacturing yield and quality in the semiconductor fabrication facility, and/or may permit the continued reduction in device and/or feature sizes of integrated circuits and/or semiconductor devices that are to be formed on semiconductor wafers.

As described in greater detail above, some implementations described herein provide a multiple transport carrier docking device. The multiple transport carrier docking device includes a first chamber configured to store a plurality of transport carriers. The multiple transport carrier docking device includes a second chamber. The multiple transport carrier docking device includes a divider wall between the first chamber and the second chamber. where the divider wall includes an opening between the first chamber and the second chamber. The multiple transport carrier docking device includes a chamber door configured to form an air-tight seal against the divider wall and around the opening.

As described in greater detail above, some implementations described herein provide a method. The method includes positioning a transport carrier on a moveable platform of a plurality of moveable platforms included in a first chamber of a multiple transport carrier docking device. The method includes contracting a sealing component of the multiple transport carrier docking device around the transport carrier to form an air-tight seal around the transport carrier. The method includes after forming the air-tight seal around the transport carrier removing a carrier door of the transport carrier, and opening a chamber door of the multiple transport carrier docking device to permit access to the transport carrier through an opening in a divider wall between the first chamber and a second chamber of the multiple transport carrier docking device. The method includes accessing, using a wafer transport tool associated with the multiple transport carrier docking device, the transport carrier while the air-tight seal is around the transport carrier.

As described in greater detail above, some implementations described herein provide a multiple transport carrier docking device. The multiple transport carrier docking device includes a first chamber configured to store a plurality of transport carriers. The multiple transport carrier docking device includes a second chamber adjacent to the first chamber. The multiple transport carrier docking device includes a divider wall between the first chamber and the second chamber, where the divider wall includes an opening between the first chamber and the second chamber. The multiple transport carrier docking device includes a chamber door, included in the second chamber, configured to form a first air-tight seal against the divider wall and around the opening. The multiple transport carrier docking device includes a sealing component, included in the first chamber, configured to form a second air-tight seal between the first chamber and a transport carrier in the first chamber.

As described in greater detail above, some implementations described herein provide a method. The method includes retrieving, using a wafer transport tool, a wafer from a semiconductor processing tool. The method includes providing, using the wafer transport tool, the wafer to a transport carrier positioned on a moveable platform of a plurality of moveable platforms included in a first chamber of a multiple transport carrier docking device while a first air-tight seal is formed around the transport carrier by a sealing component of the multiple transport carrier docking device. The method includes placing a carrier door onto the transport carrier while the first air-tight seal is around the front portion of the transport carrier. The method includes placing a chamber door against a divider wall between the first chamber and a second chamber of the multiple transport carrier docking device to close an opening in the divider wall and to form a second air-tight seal between the chamber door and the divider wall. The method includes retracting the sealing component to remove the first air-tight seal around the transport carrier after the second air-tight seal is formed.

The foregoing outlines features of several embodiments so that those skilled in the art may better understand the aspects of the present disclosure. Those skilled in the art should appreciate that they may readily use the present disclosure as a basis for designing or modifying other processes and structures for carrying out the same purposes and/or achieving the same advantages of the embodiments introduced herein. Those skilled in the art should also realize that such equivalent constructions do not depart from the spirit and scope of the present disclosure, and that they may make various changes, substitutions, and alterations herein without departing from the spirit and scope of the present disclosure.

What is claimed is:

1. A docking device, comprising:
   a chamber;
   a divider wall;
   a set of tracks included in the chamber and mounted to the divider wall;
   a moveable frame included in the chamber and mounted to the set of tracks,
   wherein the moveable frame is configured to slide along the set of tracks; and
   a sealing component, mounted to the moveable frame, configured to form a continuous air-tight seal between the moveable frame and a transport carrier in the chamber,
   wherein to form the continuous air-tight seal:
   a first portion of the sealing component is configured to transition inward in a horizontal direction and in parallel with the divider wall, and
   a second portion of the sealing component is configured to transition inward in a vertical direction and in parallel with the divider wall.

2. The docking device of claim 1, wherein the moveable frame is configured to move in parallel with the divider wall.

3. The docking device of claim 1, wherein the transport carrier is configured to move vertically.

4. The docking device of claim 1, wherein the transport carrier is configured to move horizontally.

5. The docking device of claim 1, wherein one or more of the first portion or the second portion is configured to transition in a non-linear path of travel.

6. The docking device of claim 1, further comprising:
a moveable platform comprising one or more latches.

7. The docking device of claim 6, wherein the moveable frame comprises one or more connectors configured to connect with the one or more latches.

8. The docking device of claim 7, wherein the moveable frame is configured to slide along the set of tracks based on the one or more connectors being connected to the one or more latches.

9. A method, comprising:
positioning a transport carrier in a chamber by moving the transport carrier horizontally toward an opening of a divider wall;
moving a moveable frame along a set of tracks mounted to the divider wall;
contracting a sealing component, that is mounted to the moveable frame, around the transport carrier to form a continuous air-tight seal between the moveable frame and the transport carrier,
wherein contracting the sealing component comprises:
transitioning a first portion of the sealing component inward in a horizontal direction and in parallel with the divider wall, and
transitioning a second portion of the sealing component inward in a vertical direction and in parallel with the divider wall; and
accessing, using a wafer transport tool, a wafer while the continuous air-tight seal is around the transport carrier.

10. The method of claim 9, wherein moving the moveable frame comprises:
moving the moveable frame in parallel with the divider wall.

11. The method of claim 9, wherein positioning the transport carrier comprises:
moving the transport carrier vertically.

12. The method of claim 9, wherein transitioning the first portion of the sealing component comprises:
transitioning the first portion of the sealing component in a non-linear path of travel.

13. The method of claim 9, wherein transitioning the second portion of the sealing component comprises:
transitioning the second portion of the sealing component in a non-linear path of travel.

14. The method of claim 9, wherein moving the moveable frame along the set of tracks comprises:
moving the moveable frame along the set of tracks based on one or more connectors of the moveable frame being connected to one or more latches of a moveable platform.

15. The method of claim 14, wherein positioning the transport carrier comprises:
positioning the transport carrier via the moveable platform.

16. A method, comprising:
moving a moveable platform within a chamber to align a transport carrier with a sealing component,
wherein the sealing component is mounted to a moveable frame;
forming a continuous air-tight seal between the moveable frame and the transport carrier by:
transitioning a first portion of the sealing component inward in a horizontal direction and in parallel with a divider wall; and
transitioning a second portion of the sealing component inward in a vertical direction and in parallel with the divider wall;
providing, via a hole in the divider wall, a wafer to the transport carrier based on the continuous air-tight seal being formed between the moveable frame and the transport carrier;
placing a carrier door onto the transport carrier while the continuous air-tight seal is formed between the moveable frame and the transport carrier; and
retracting the sealing component to remove the continuous air-tight seal between the moveable frame and the transport carrier.

17. The method of claim 16, wherein retracting the sealing component comprises:
transitioning the first portion outward in another horizontal direction; and
transitioning the second portion outward in another vertical direction.

18. The method of claim 16,
wherein forming the continuous air-tight seal between the moveable frame and the transport carrier comprises:
forming the continuous air-tight seal between the moveable frame and the transport carrier based on aligning the transport carrier with the sealing component.

19. The method of claim 18, further comprising:
moving the moveable frame in synchronization with the moveable platform.

20. The method of claim 16, further comprising:
removing, via the hole in the divider wall, another wafer from another transport carrier based on another continuous air-tight seal being formed between the moveable frame and the other transport carrier.

* * * * *